United States Patent
Huang et al.

(10) Patent No.: US 12,484,241 B2
(45) Date of Patent: *Nov. 25, 2025

(54) METHOD FOR FORMING SEMICONDUCTOR DEVICE

(71) Applicant: Taiwan Semiconductor Manufacturing Company, Ltd., Hsinchu (TW)

(72) Inventors: Wang-Chun Huang, Hsinchu (TW); Hou-Yu Chen, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 198 days.

This patent is subject to a terminal disclaimer.

(21) Appl. No.: 18/357,795

(22) Filed: Jul. 24, 2023

(65) Prior Publication Data

US 2023/0369466 A1    Nov. 16, 2023

Related U.S. Application Data

(60) Continuation of application No. 17/885,058, filed on Aug. 10, 2022, now Pat. No. 12,218,224, which is a
(Continued)

(51) Int. Cl.
*H10D 30/01* (2025.01)
*H10D 30/62* (2025.01)
(Continued)

(52) U.S. Cl.
CPC ....... *H10D 30/024* (2025.01); *H10D 30/6211* (2025.01); *H10D 84/0135* (2025.01);
(Continued)

(58) Field of Classification Search
CPC .. H10D 30/024; H10D 30/62; H10D 30/6211; H10D 30/6735; H10D 84/0135;
(Continued)

(56) References Cited

U.S. PATENT DOCUMENTS 9,818,872 B2   11/2017  Ching et al.
9,887,269 B2   2/2018   Ching et al.
(Continued)

FOREIGN PATENT DOCUMENTS

CN    111863810 A    1/2019
CN    109427774 A    3/2019
(Continued)

*Primary Examiner* — Tuan A Hoang
(74) *Attorney, Agent, or Firm* — HAYNES AND BOONE, LLP

(57) ABSTRACT

Semiconductor structures and methods of forming the same are provided. A semiconductor structure according to the present disclosure includes at least one first semiconductor element and at least one second semiconductor element over a substrate, a dielectric fin disposed between the at least one first semiconductor element and the at least one second semiconductor element, a first work function metal layer wrapping around each of the at least one first semiconductor element and extending continuously from the at least one first semiconductor element to a top surface of the dielectric fin, and a second work function metal layer disposed over the at least one second semiconductor element and the first work function metal layer.

20 Claims, 33 Drawing Sheets

Related U.S. Application Data division of application No. 17/226,891, filed on Apr. 9, 2021, now Pat. No. 11,735,647.

(60) Provisional application No. 63/141,764, filed on Jan. 26, 2021.

(51) Int. Cl.
    *H10D 84/01*    (2025.01)
    *H10D 84/03*    (2025.01)
    *H10D 30/67*    (2025.01)

(52) U.S. Cl.
    CPC ....... *H10D 84/014* (2025.01); *H10D 84/0158* (2025.01); *H10D 84/0172* (2025.01); *H10D 84/0177* (2025.01); *H10D 84/038* (2025.01); *H10D 30/6735* (2025.01); *H10D 84/0151* (2025.01); *H10D 84/0188* (2025.01)

(58) Field of Classification Search
    CPC ........... H10D 84/0172; H10D 84/0177; H10D 84/0151; H10D 84/0158; H10D 84/0188; H10D 84/0193; H10D 84/845; H10D 84/853

See application file for complete search history.

(56) References Cited

U.S. PATENT DOCUMENTS

| | | |
|---|---|---|
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2005/0250258 A1 | 11/2005 | Metz et al. |
| 2017/0330801 A1 | 11/2017 | Ragnarsson et al. |
| 2018/0175036 A1 | 6/2018 | Ching et al. |
| 2018/0337190 A1 | 11/2018 | Li |
| 2019/0067120 A1* | 2/2019 | Ching .................. H10D 30/611 |
| 2020/0020689 A1 | 1/2020 | Ohtou |
| 2020/0035567 A1* | 1/2020 | Chanemougame ......................... H10D 84/0193 |
| 2020/0035786 A1 | 1/2020 | Xie et al. |
| 2020/0127113 A1 | 4/2020 | Ching et al. |

FOREIGN PATENT DOCUMENTS

| | | |
|---|---|---|
| KR | 20180069671 A | 6/2018 |
| KR | 20190024534 A | 3/2019 |
| KR | 20200007711 A | 1/2020 |
| TW | 201903858 A | 1/2019 |

\* cited by examiner

US 12,484,241 B2

1
METHOD FOR FORMING SEMICONDUCTOR DEVICE

PRIORITY DATA

This application is a continuation of U.S. patent application No. U.S. patent application Ser. No. 17/885,058 filed Aug. 10, 2022, which is a divisional application of U.S. patent application Ser. No. 17/226,891, filed Apr. 9, 2021, which claims priority to U.S. Provisional Patent Application No. 63/141,764, filed on Jan. 26, 2021, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

As the scaling down of IC devices continues to increase chip density, spacings between adjacent active regions also decrease. One of the limiting factors for successful scaling down is mask overlay in photolithography processes. While existing methods for forming multi-gate devices are adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

2

Figure 1:
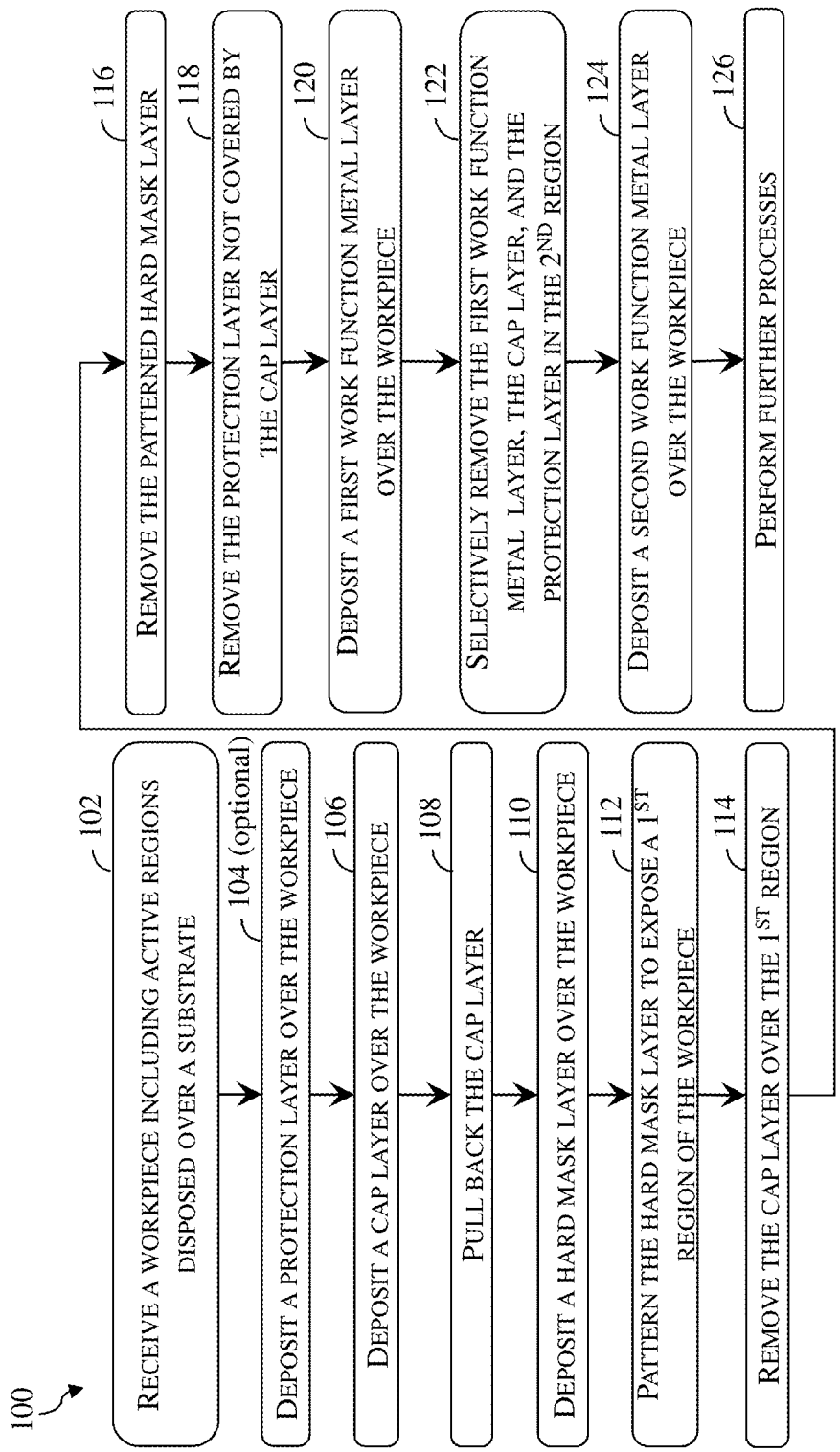

FIG. 1 illustrates a flowchart of a method for forming a semiconductor structure, according to one or more aspects of the present disclosure.

FIGS. 2-32 illustrate fragmentary cross-sectional views of a workpiece during various fabrication stages in the method of FIG. 1, according to one or more aspects of the present disclosure.

Figure 33:
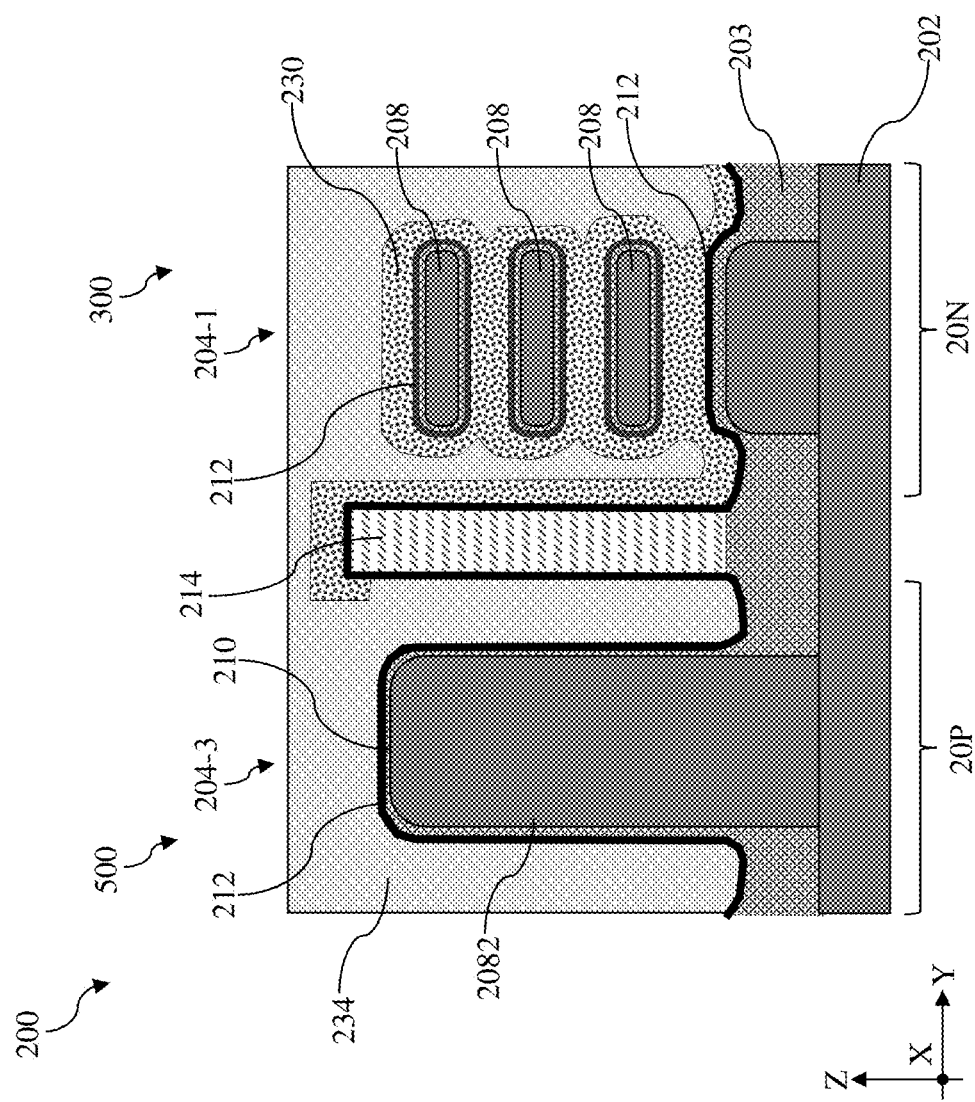

FIG. 33 illustrates an alternative semiconductor structure that includes different active region configurations, according to one or more aspects of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +1-15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In IC design, a plurality of devices may be grouped together as a cell or a standard cell to perform certain circuit functions. Such a cell or a standard cell may perform logic operations, such as NAND, AND, OR, NOR, or inverter, or serve as a memory cell, such as a static random access memory (SRAM) cell. The size of a cell, such as a cell height, becomes a bench mark to gauge device scaling. One of the factors limiting the scaling down of cell heights is the overlay window of photolithography processes for patterning adjacent metal gates. For example, devices with different gate structure constructions may be placed adjacent to one another. Formation of such devices requires formation of patterned hard mask layers. Unsatisfactory mask overlay may lead to incomplete removal of hard mask layers. Residual hard mask layers may hinder deposition of different work function layers, resulting in substantial deviation from the design threshold voltage levels.

The present disclosure provides methods of forming semiconductor structures having different work function metal layers. An example method of the present disclosure includes formation of a protection layer over different active regions and a dielectric fin, a cap layer over the protection layer, and a hard mask layer over the cap layer. The cap layer introduces self-alignment in the patterning process while the protection layer serves as an etch stop layer or an etch retardation layer to protect the active regions. Because the cap layer may be selectively etched away without substantially etching the hard mask layer, the active regions may be selectively exposed for work function metal layer deposition even when the patterning of the hard mask layer is not accurate due to lack-than-satisfactory mask overlay. The cap layer may also be referred to as a sacrificial layer. Methods of the present disclosure enlarge the overlay process window and improve satisfactory formation of different work function metal layers.

The various aspects of the present disclosure will now be described in more detail with reference to the figures. FIG. 1 illustrates a flowchart of a method 100 of forming a semiconductor structure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-32, which illustrate fragmentary cross-sectional views of a workpiece 200 at different stages of fabrication according to embodiments of method 100. Because a semiconductor structure or a semiconductor device will be formed from the workpiece 200, the workpiece 200 may be referred to as a semiconductor structure 200 or a semiconductor device 200 as the context requires. Throughout the present disclosure, like reference numerals are used to denote like features. The X direction, the Y direction, and the Z direction in FIGS. 2-32 are perpendicular to one another and are used consistently herein.

Figure 2:
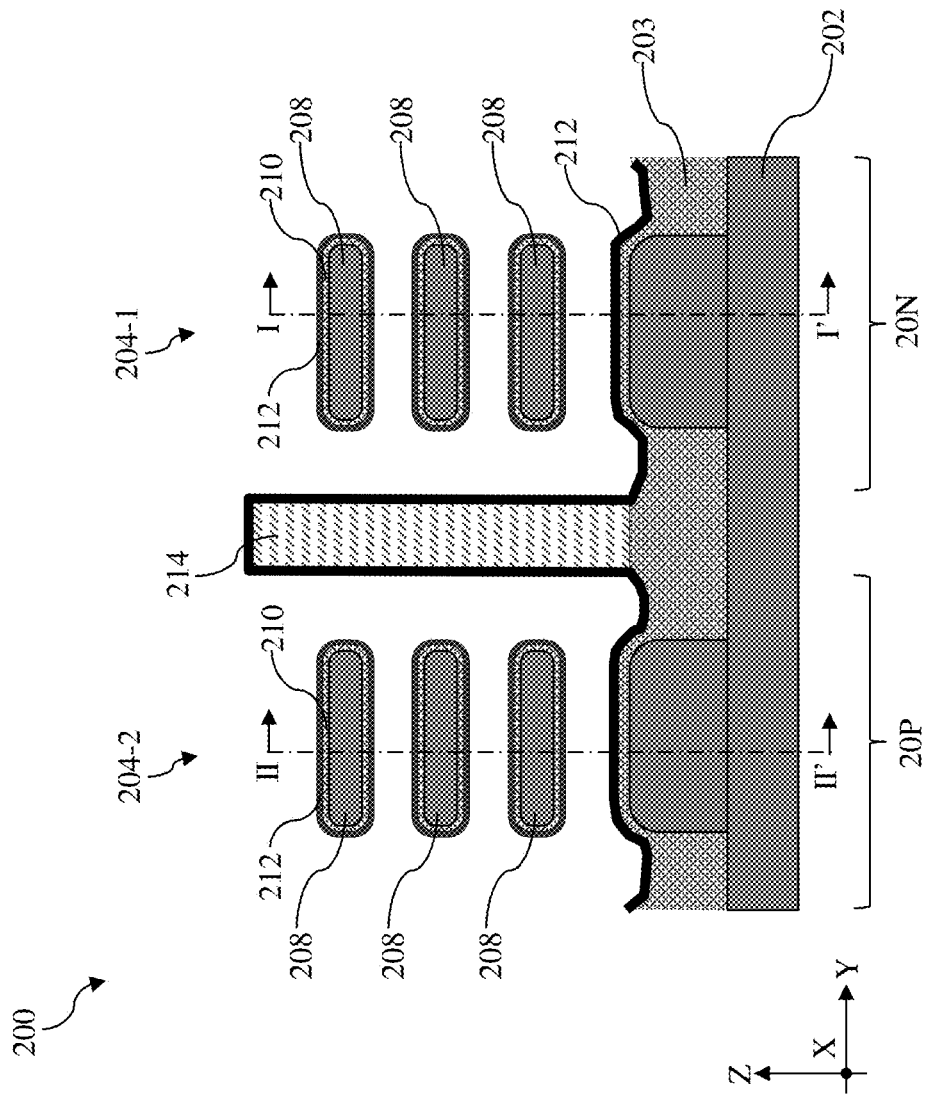
Figure 3:
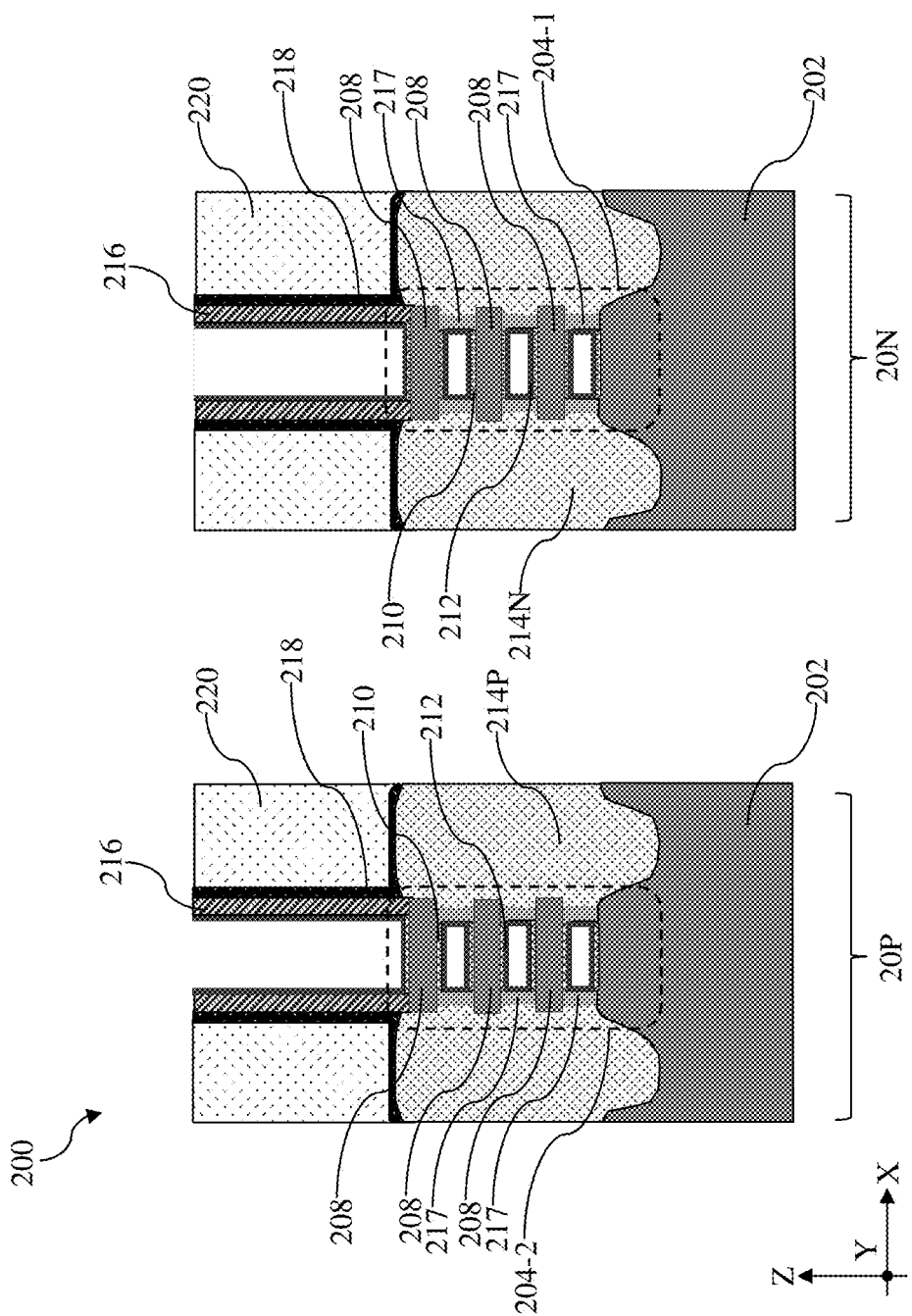

Referring to FIGS. 1, 2 and 3, method 100 includes a block 102 where a workpiece 200 is received. Referring to FIG. 2, the workpiece 200 includes a first active region 204-1 and a second active region 204-2 over a substrate 202. Depending on the design of the semiconductor device 200, the first active region 204-1 and the second active region 204-2 may be active regions of a FinFET or an MBC transistor. When the first active region 204-1 or the second active region 204-2 is an active region for a FinFET, it may include a fin element, such as a third active region 204-3 shown in FIG. 33. When the first active region 204-1 or the second active region 204-2 is an active region for an MBC transistor, it may include a vertical stack of channel members 208, such as the first active region 204-1 and the second active region 204-2 shown in FIGS. 2-32. The channel members 208 are nanostructures and may come in shapes of nanowires or nanosheets. Each of the channel members 208 and the fin element (such as the third active region 204-3) may be generally referred to as a semiconductor element.

The substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GeOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion. The semiconductor elements in the first active region 204-1 and the second active region 204-2 may be formed of a semiconductor material, such as silicon (Si), germanium (Ge), or silicon germanium (SiGe). In the depicted embodiment represented in FIG. 2, the channel members 208 include silicon (Si).

An interfacial layer 210 is disposed on the first active region 204-1 and the second active region 204-2. The interfacial layer 210 includes silicon oxide and may be formed as result of a pre-clean process or an oxidation process. An example pre-clean process may include use of RCA SC-1 (ammonia, hydrogen peroxide and water) and/or RCA SC-2 (hydrochloric acid, hydrogen peroxide and water). The pre-clean process oxidizes the exposed semiconductor surfaces of the channel members 208 and the substrate 202 to form the interfacial layer 210.

The first active region 204-1 and the second active region 204-2 rise from the substrate 202 and extend through an isolation feature 203 that disposed on the substrate 202. The isolation feature 203 may also be referred to as a shallow trench isolation (STI) feature 203. In some embodiments, the isolation feature 203 may include silicon oxide, silicon nitride, silicon oxynitride, fluorine-doped silicate glass (FSG), a low-k dielectric, combinations thereof, and/or other suitable materials.

Figure 27:
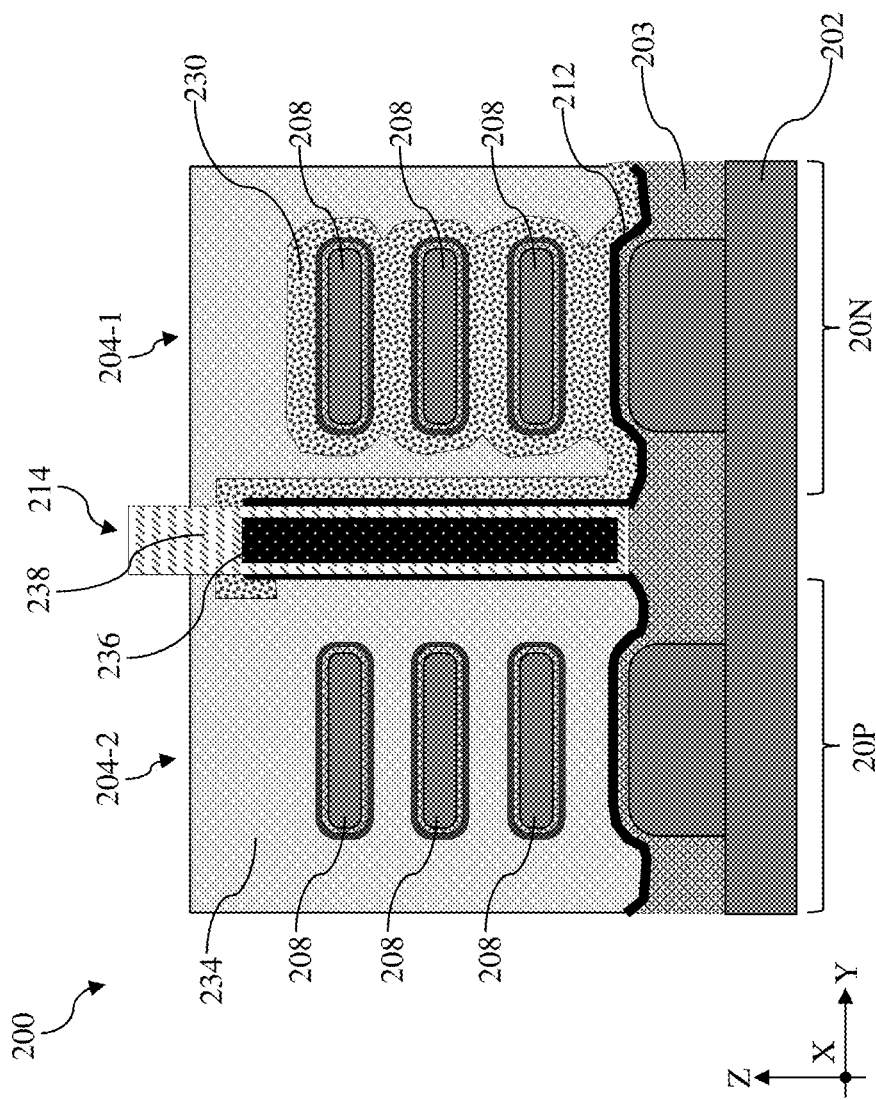
Figure 28:
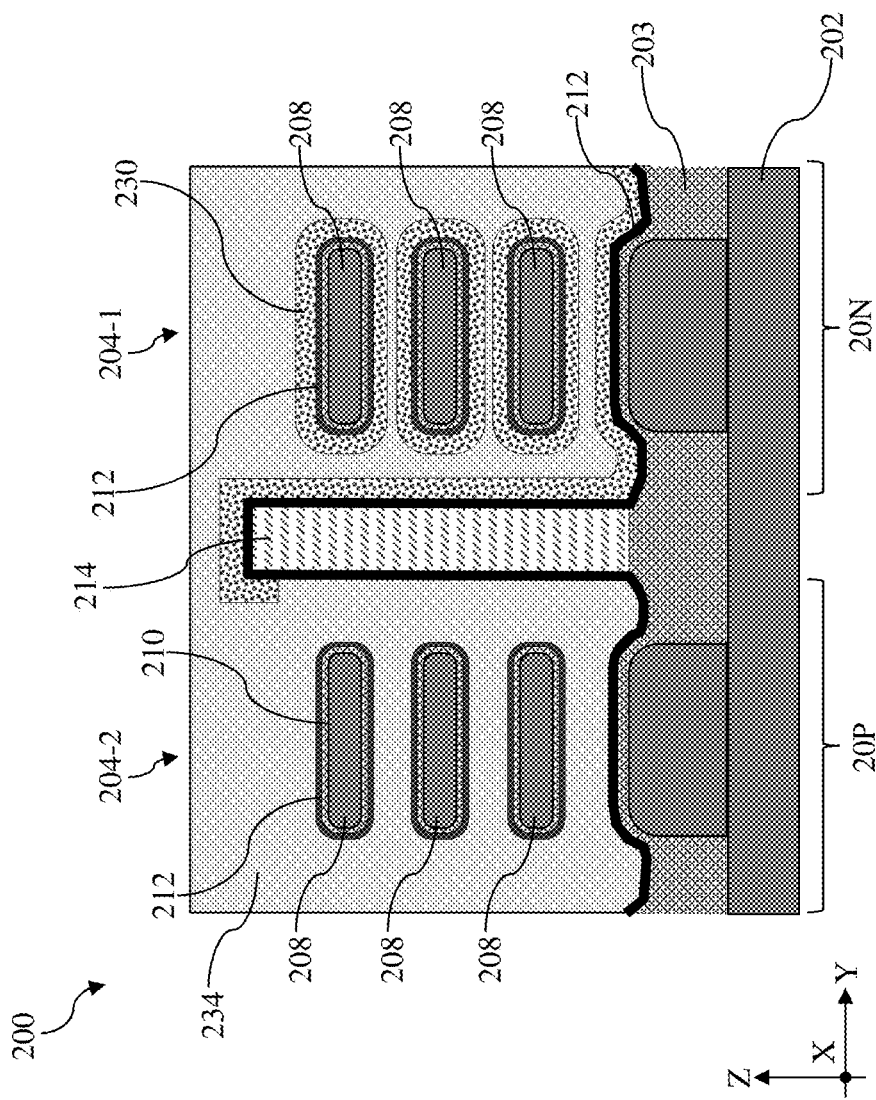

Referring to FIG. 2, the workpiece 200 includes a dielectric fin 214 disposed on the isolation feature 203. As shown in FIG. 2, the dielectric fin 214 is disposed between the first active region 204-1 and the second active region 204-2 along the Y direction. A top surface of the dielectric fin 214 is higher than top surfaces of the first active region 204-1 and the second active region 204-2. The dielectric fin 214 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, silicon oxide, silicon oxynitride, silicon oxycarbonitride, or a suitable dielectric material. The dielectric fin 214 may be a single layer or a multiple layer. A single-layer dielectric fin 214 is shown in FIG. 2 and an example multi-layer dielectric fin 214 is illustrated in FIG. 27. When the dielectric fin 214 is a multi-layer as shown in FIG. 27, it may include an inner layer 236 and an outer layer 238 that wraps over the inner layer 236. A dielectric constant of the outer layer 238 is greater than a dielectric constant of the inner layer 236. In some instances, a dielectric constant of the outer layer 238 is equal to or greater than 7 while a dielectric constant of the inner layer 236 is smaller than 7. The higher-dielectric-constant outer layer 238 serves as an etch resistant layer while the lower-dielectric-constant inner layer 236 functions to reduce parasitic capacitance. In some instances, the outer layer 238 may be formed of silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, or hafnium oxide. The inner layer 236 may be formed of silicon oxide, silicon carbide, silicon oxynitride, silicon oxycarbonitride, or a suitable dielectric material.

Referring still to FIG. 2, a gate dielectric layer 212 is disposed on surfaces of the interfacial layer 210, a top surface of the dielectric fin 214, and sidewalls of the dielectric fin 214. As shown in FIG. 2, the interfacial layer 210 and the gate dielectric layer 212 wrap around each of the channel members 208 in the first active region 204-1 and the second active region 204-2. The gate dielectric layer 212 is formed of a high-k dielectric material which has a dielectric constant greater than that of silicon dioxide (~3.9). In one embodiment, the gate dielectric layer 212 may include hafnium oxide ($HfO_2$). In some other embodiments, the gate dielectric layer 212 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

Reference is still made to FIG. 2. The first active region 204-1 may be disposed in an n-type device region 20N of the substrate 202 and the second active region 204-2 may be disposed in a p-type device region 20P. In some embodiments, while not explicitly shown in FIG. 2, the n-type device region 20N of the substrate 202 may include a p-type well that is doped with a p-type dopant, such as boron ($B_2$) and the p-type device region 20P of the substrate 202 may include an n-type well that is doped with an n-type dopant, such as phosphorus (P) or arsenic (As). Fragmentary cross-sectional views of cross-section I-I' through the first active region 204-1 and cross-section II-II' through the second active region 204-2 are shown in FIG. 3. Comparable fragmentary cross-sectional views across the first active region 204-1 and the second active region 204-2 in FIGS. 5, 7, 9, 11, 13, 15, 17, 19, 21, 23, 25 are illustrated in FIGS. 6, 8, 10, 12, 14, 16, 18, 20, 22, 24, 26, respectively.

Referring to FIG. 3, the channel members 208 in the n-type device region 20N and in the p-type device region 20P are interleaved by a plurality of inner spacer features 217. The plurality of inner spacer features 217 may include silicon nitride, silicon oxycarbonitride, silicon carbonitride, silicon oxide, silicon oxycarbide, silicon carbide, silicon oxynitride, or a combination thereof. In one embodiment, the plurality of inner spacer features 217 are formed of silicon nitride. The channel members 208 in the n-type device region 20N are sandwiched between two n-type source/drain features 214N. In some embodiments, the two n-type source/drain features 214N include silicon (Si) and at least one n-type dopant, such as phosphorus (P) or arsenic (As). The channel members 208 in the p-type device region 20P are sandwiched between two p-type source/drain features 214P. In some embodiments, the two p-type source/drain features 214P include silicon germanium (SiGe) and at least one p-type dopant, such as boron (B). The n-type source/drain features 214N and the p-type source/drain features 214P are formed using an epitaxial process, such as vapor-phase epitaxy (VPE), ultra-high vacuum CVD (UHV-CVD), molecular beam epitaxy (MBE), and/or other suitable processes. For that reason, the n-type source/drain features 214N may also be referred to as the n-type epitaxial features 214N and the p-type source/drain features 214P may also be referred to as the p-type epitaxial features 214P.

The workpiece 200 also includes a contact etch stop layer (CESL) 218 and an interlayer dielectric (ILD) layer 220 disposed over the n-type source/drain features 214N and the p-type source/drain features 214P. The CESL 218 may include silicon nitride, silicon oxide, silicon oxynitride, and/or other materials known in the art. The ILD layer 220 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. As shown in FIG. 3, the CESL 218 is disposed on top surfaces of the n-type source/drain features 214N and the p-type source/drain features 214P as well as sidewalls of gate spacer layers 216. In a gate-last or replacement gate process, the gate spacer layers 216 are formed over sidewalls of dummy gate stacks that serve as placeholder for functional gate structures. After the removal of the dummy gate stacks and the release of the channel members 208, the gate spacer layers 216 shown in FIG. 3 define gate openings that expose the channel members 208. The gate spacer layers 216 may be a single layer or a multi-layer and may include silicon nitride, silicon oxycarbonitride, silicon carbonitride, silicon oxide, silicon oxycarbide, silicon carbide, silicon oxynitride, and/or combinations thereof.

Figure 4:
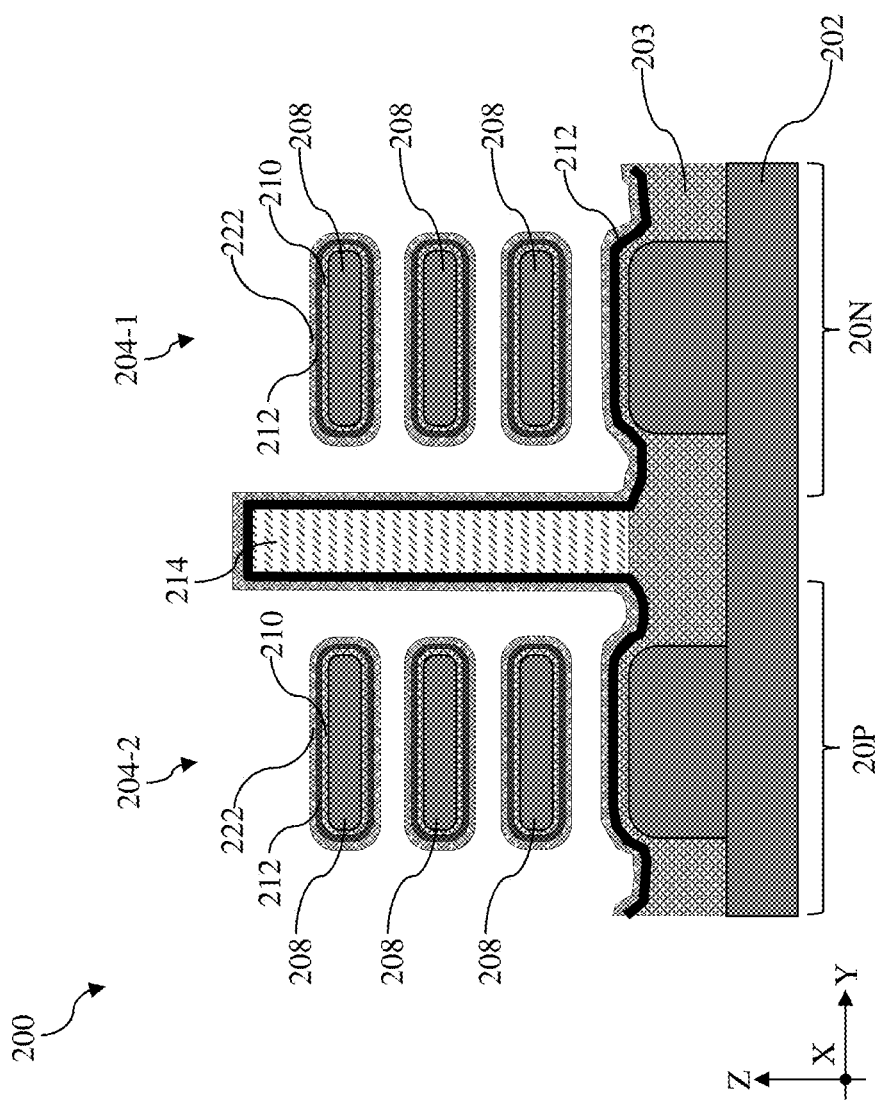

Referring to FIGS. 1 and 4, method 100 may optionally include a block 104 where a protection layer 222 is deposited over the workpiece 200. As shown in FIG. 4, the protection layer 222 is deposited over surfaces of the gate dielectric layer 212 to wrap around each of the channel members 208 and wrap over the dielectric fin 214. The protection layer 222 may include a metal nitride, such as titanium nitride (TiN) or tantalum nitride (TaN) or titanium silicon nitride (TiSiN). In one embodiment, the protection layer 222 is formed of titanium nitride (TiN). In some embodiments, the protection layer 222 may be deposited using ALD or CVD. The protection layer 222 protects the gate dielectric layer 212 and the channel members 208 from being damaged in subsequent processes. The protection layer 222 may be omitted if the cap layer 224 (to be described below) may be selectively removed without substantially damaging the gate dielectric layer 212.

Figure 5:
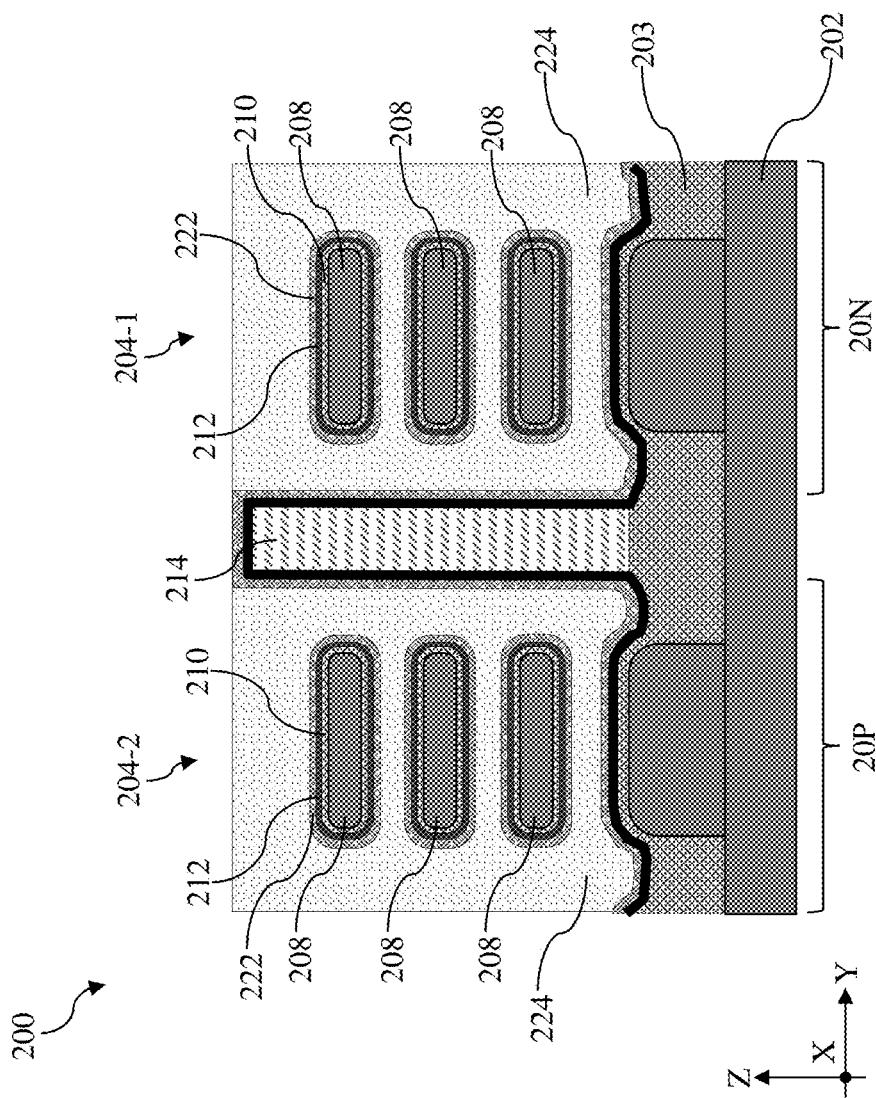
Figure 6:
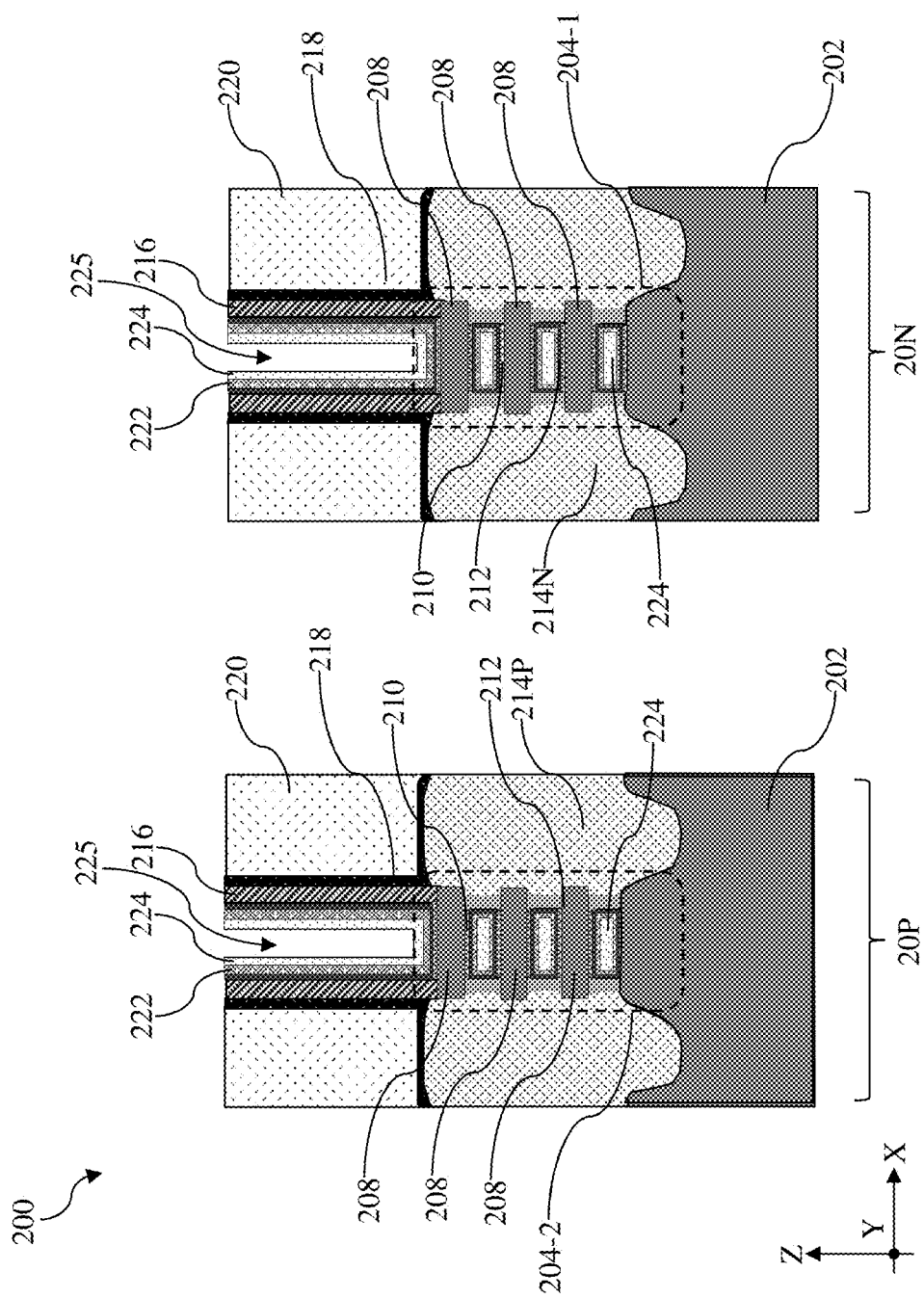

Referring to FIGS. 1, 5 and 6, method 100 includes a block 106 where a cap layer 224 is deposited over the workpiece 200. As shown in FIGS. 5 and 6, the cap layer 224 is deposited over the workpiece 200 to fill the space between and around the channel members 208, including the space between the channel members 208 and the dielectric fin 214 along the Y direction. The cap layer 224 includes silicon (Si) and may be deposited using ALD, CVD, or a suitable method. As will be described below, the cap layer 224, when exposed in a patterned hard mask layer, may be selectively removed without damaging the protection layer 222. As shown in FIG. 6, the protection layer 222 and the cap layer 224 completely fill the space between channel members 208

(i.e., member-to-member space) but they do not completely fill the space between the gate spacer layers 216. In FIG. 6, the protection layer 222 and the cap layer 224 extend along sidewalls of the gate spacer layers 216, leaving a gap 225. After the deposition of the cap layer 224, block 106 may include a post deposition anneal process to improve the quality of the interface between the cap layer 224 and the protection layer 222. In some implementations, the post deposition anneal process may include an anneal temperature between about 700° C. and about 950° C. in a nitrogen-containing ambient, such as a nitrogen ($N_2$) ambient or an ammonia ($NH_3$) ambient.

Figure 7:
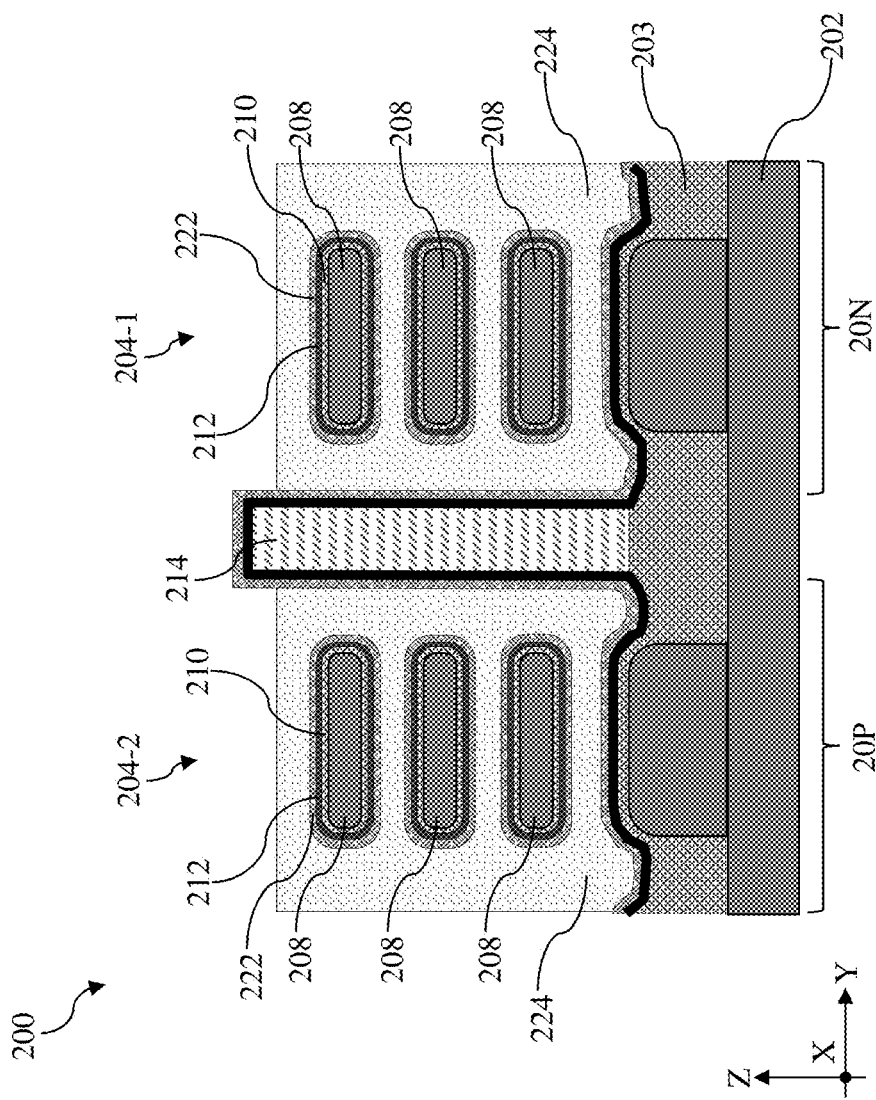
Figure 8:
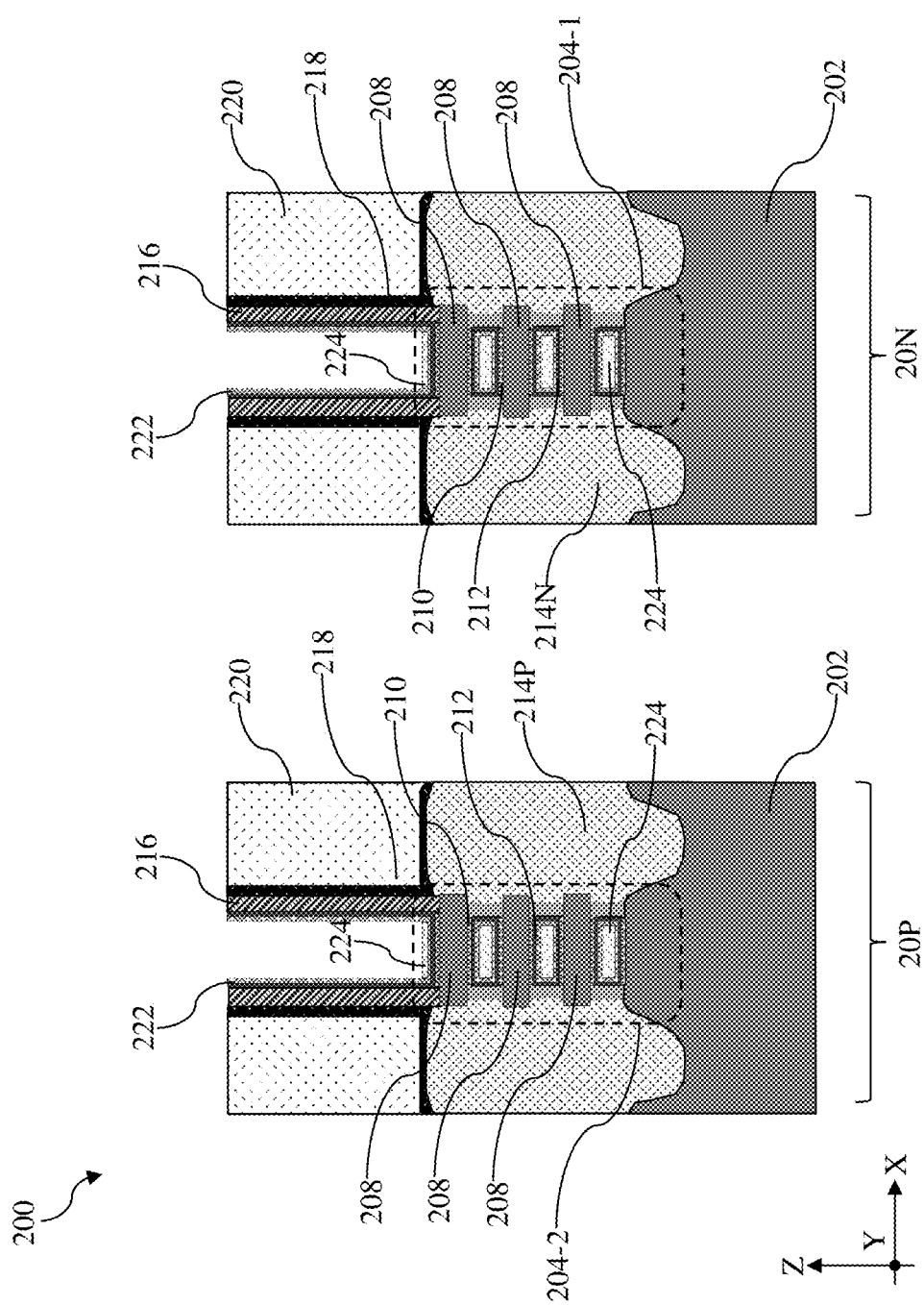

Referring to FIGS. 1, 7 and 8, method 100 includes a block 108 where the cap layer 224 is pulled back. In some implementations, the pull back at block 108 may include a selective wet etch process or an anisotropic dry etch process. Example selective wet etch process may include use of ammonium hydroxide ($NH_4OH$), hydrogen peroxide ($H_2O_2$), or diluted hydrofluoric acid (DHF). Digital etching techniques may be used when oxidizers (such as hydrogen peroxide ($H_2O_2$), or diluted hydrofluoric acid (DHF)) are used. Example dry etch processes may include use of oxygen, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In one embodiment, the pull back at block 108 includes a selective wet etch process. As shown in the FIG. 7, the pull back at block 108 is performed to remove sufficient cap layer 224 such that the dielectric fin 214, along with the gate dielectric layer 212 and the protection layer 222, rises above the cap layer 224. Put differently, the pull back at block 108 is performed until the dielectric fin 214 separate a first portion over the n-type device region 20N and a second portion over the p-type device region 20P. Referring to FIG. 8, the pull back at block 108 removes all cap layer 224 disposed on sidewalls of the gate spacer layers 216, thereby exposing the protection layer 222 on sidewalls of the gate spacer layers 216. The member-to-member spaces between channel members 208 remain filled with the cap layer 224. In some embodiments represented in FIG. 8, a small portion of the cap layer may still be disposed over the topmost channel members 208.

Figure 9:
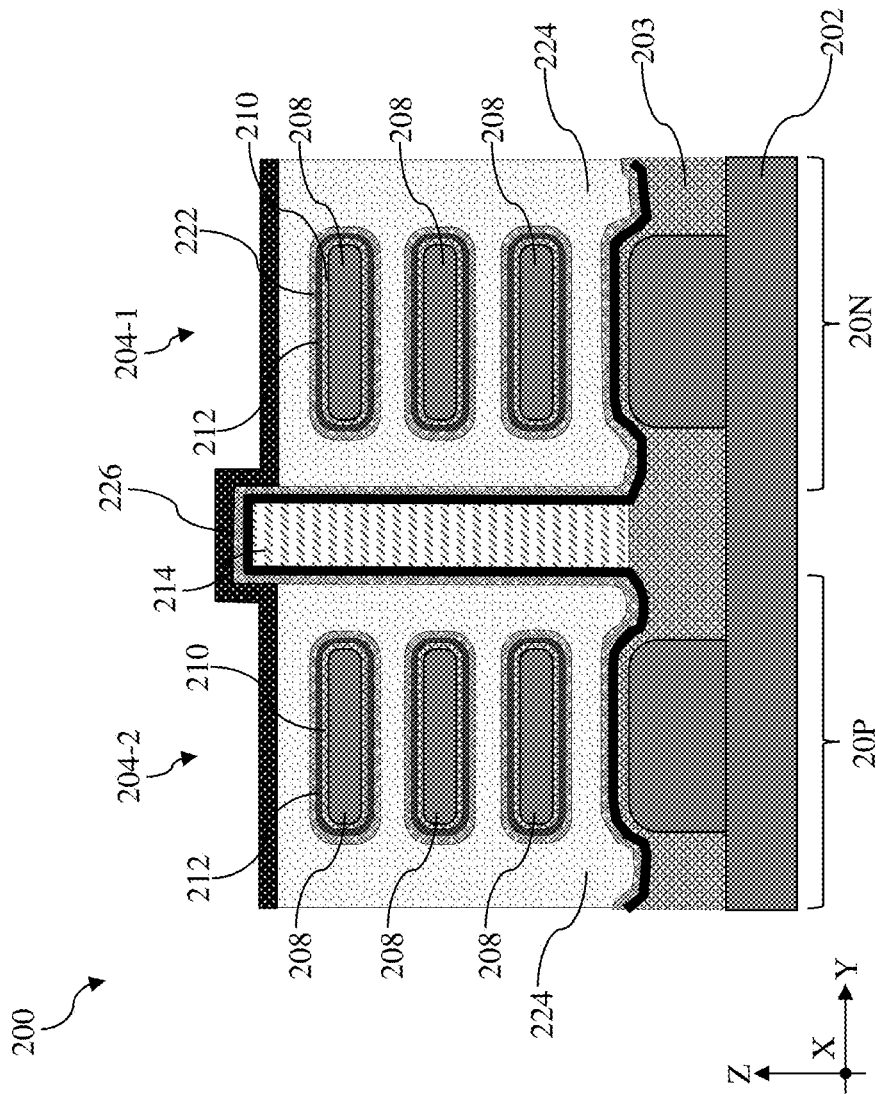
Figure 10:
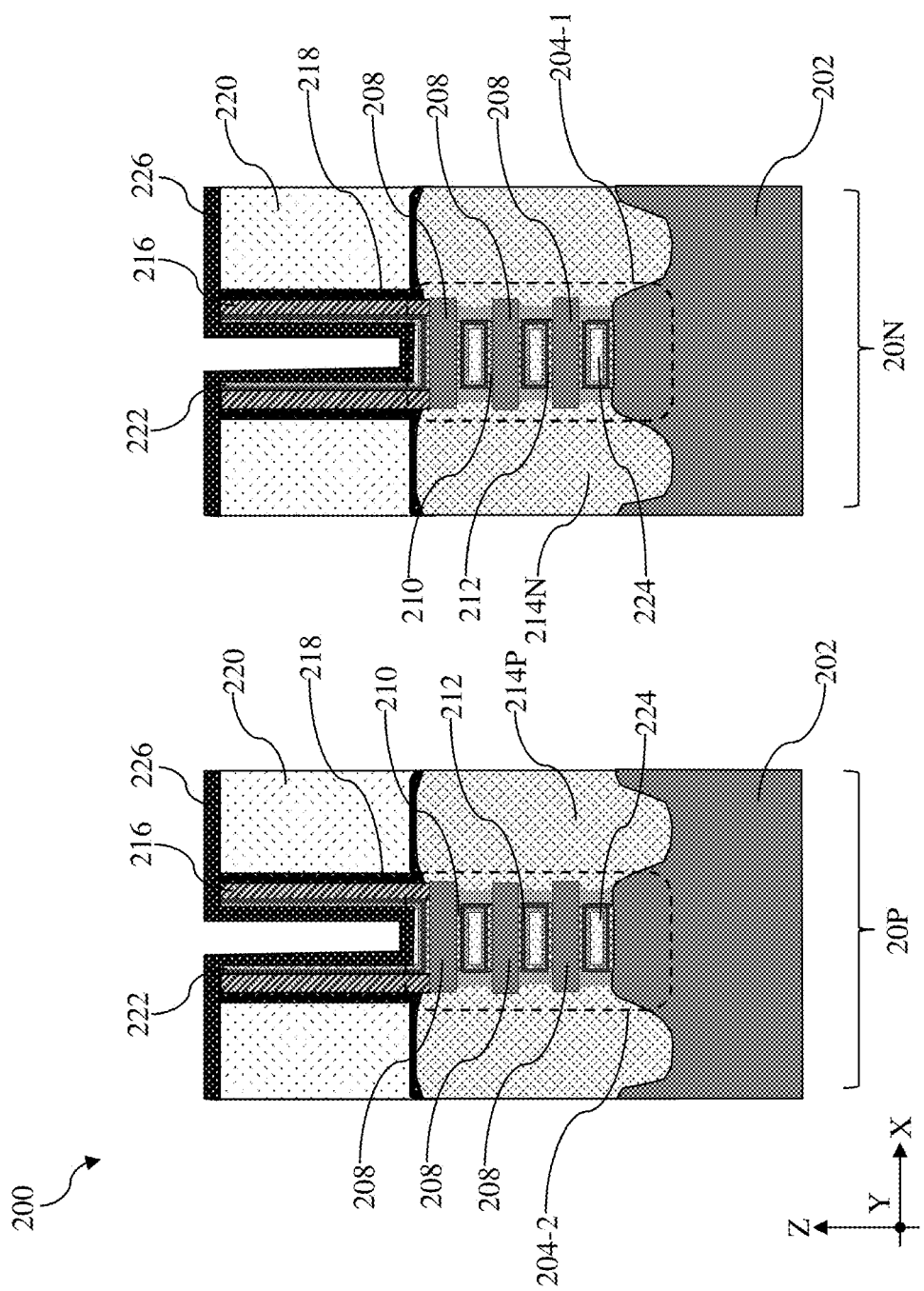

Referring to FIGS. 1, 9 and 10, method 100 includes a block 110 where a hard mask layer 226 is deposited over the workpiece 200. As will be described below, the hard mask layer 226 serves as an etch mask to selectively remove the cap layer 224 over the n-type device region 20N or the p-type device region 20P. In some embodiments, the hard mask layer 226 may be conformally deposited using CVD, ALD, or a suitable deposition method. The hard mask layer 226 may include aluminum oxide (AlO), aluminum nitride (AlN), aluminum oxynitride (AlON), zirconium oxide (ZrO), zirconium nitride (ZrN), zirconium aluminum oxide (ZrAlO), hafnium oxide (HfO), zinc oxide (ZnO), yttrium oxide (YO), titanium oxide (TiO), other metal oxide, or a suitable dielectric material. In some other embodiment, the hard mask layer 226 may be a multilayer. As shown in FIG. 9, the hard mask layer 226 is conformally deposited on top surfaces of the cap layer 224 and surfaces of the protection layer 222 on the portion of the dielectric fin 214 that protrude from the cap layer 224. Referring to FIG. 10, the hard mask layer 226 is deposited on top surfaces of the CESL 218, the ILD layer 220, the gate spacer layers 216, and the protection layer 222 that extends along sidewalls of the gate spacer layers 216.

Figure 11:
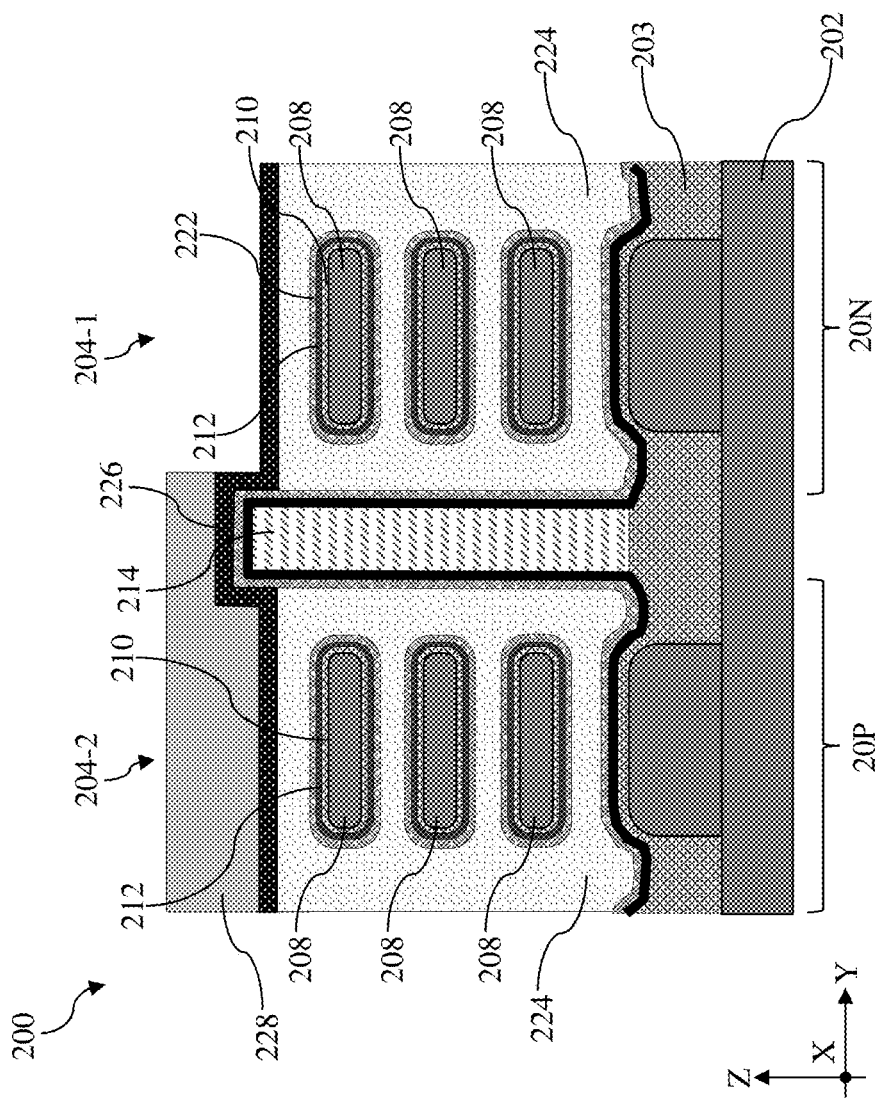
Figure 12:
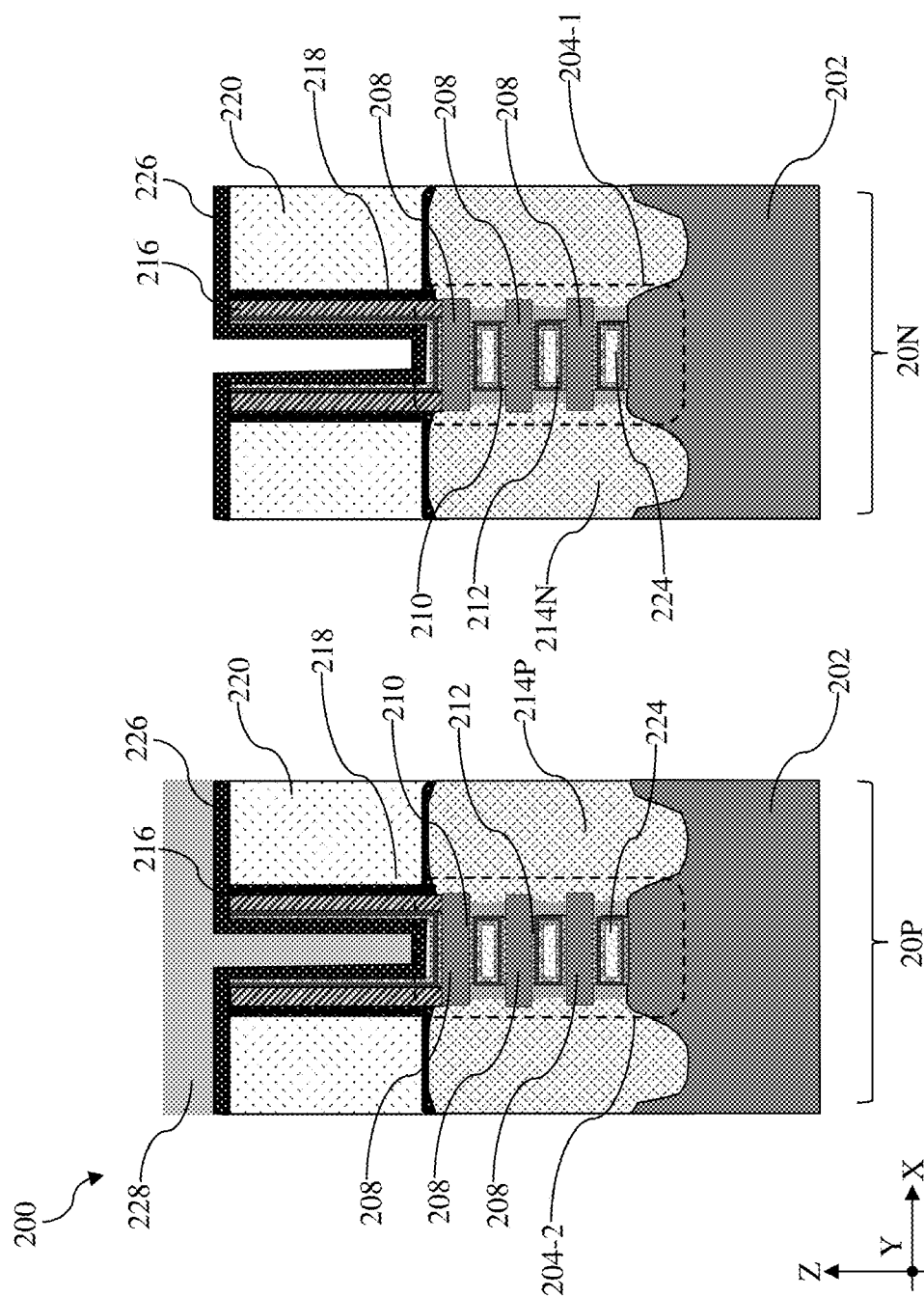
Figure 13:
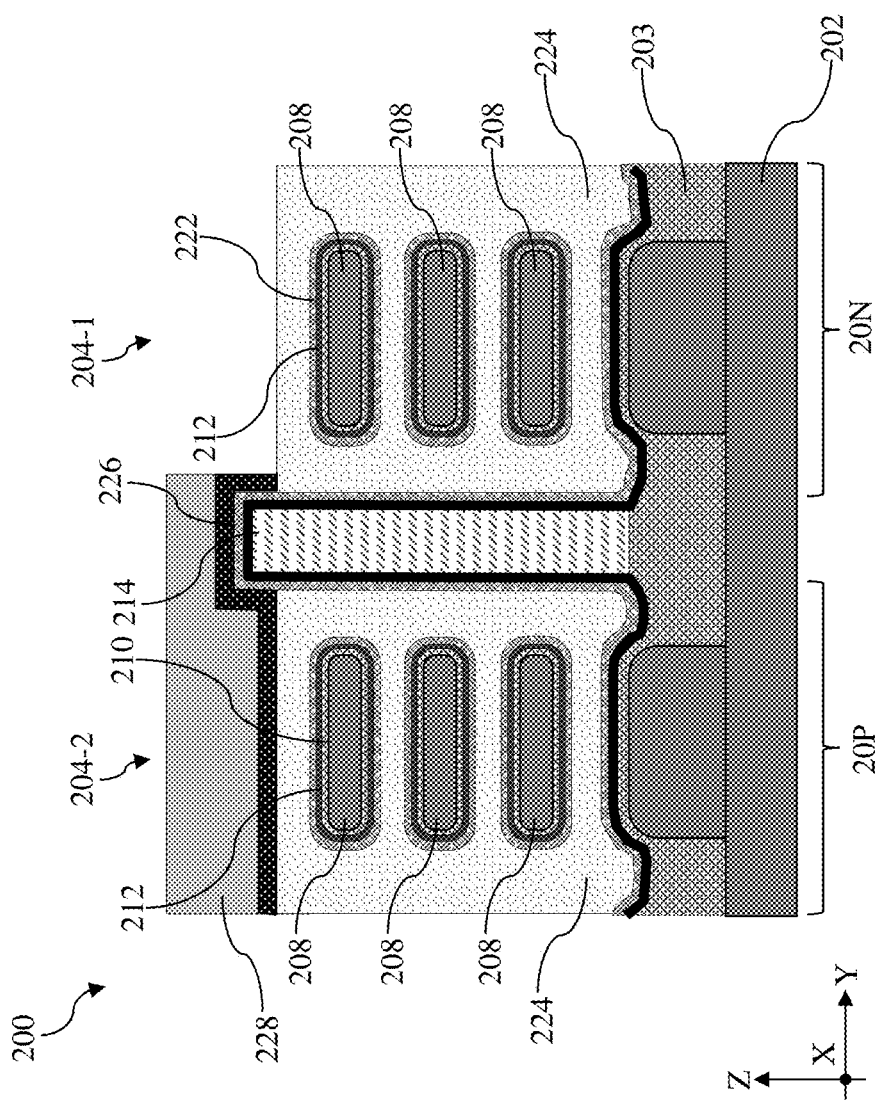
Figure 14:
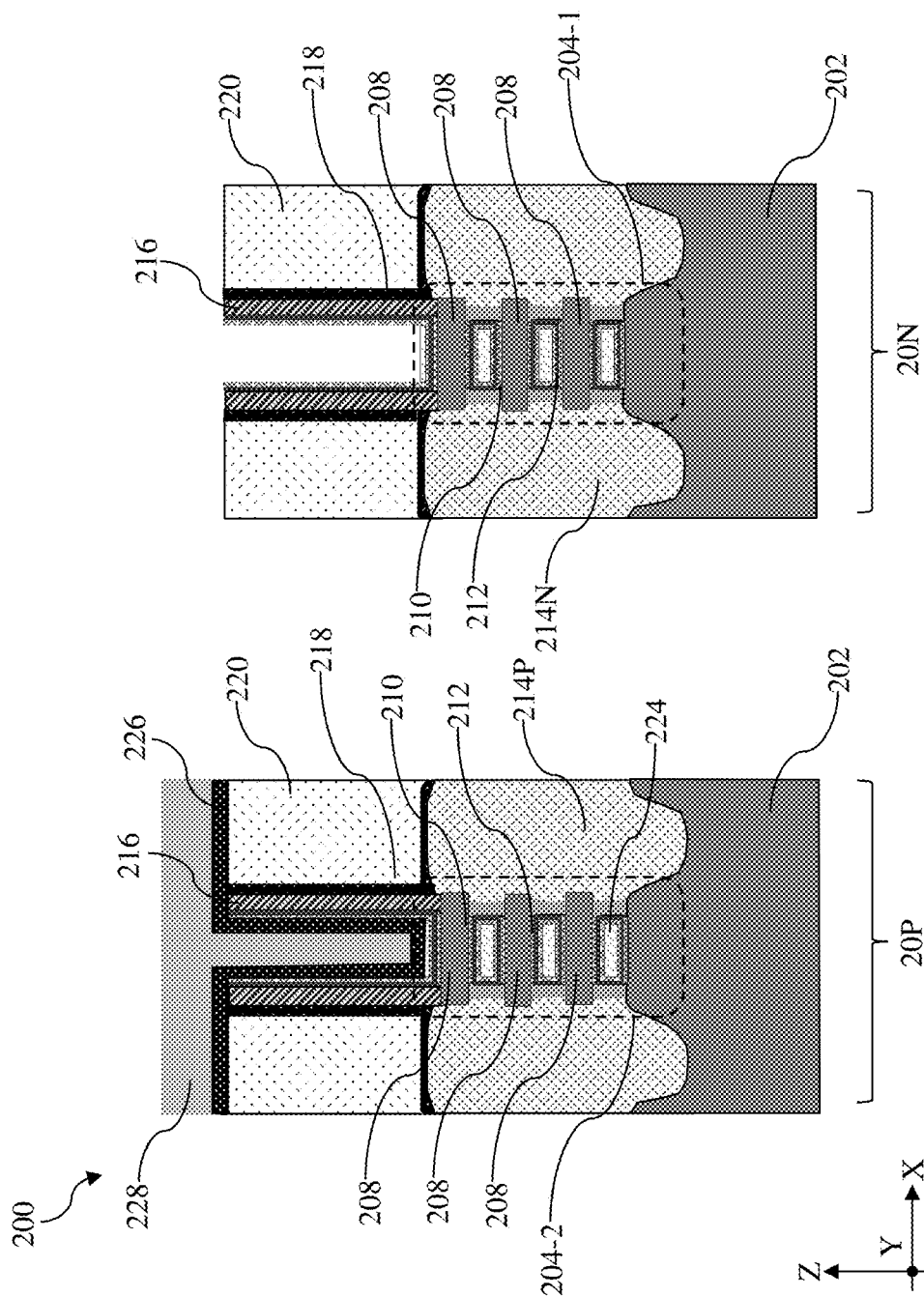

Referring to FIGS. 1, 11, 12, 13, and 14, method 100 includes a block 112 where the hard mask layer 226 is patterned to expose an n-type device region 20N of the workpiece 200. Referring first to FIGS. 11 and 12, a first bottom anti-reflective coating (BARC) layer 228 is deposited over the workpiece 200 and is patterned by photolithography techniques to expose the hard mask layer 226 over the n-type device region 20N. The first BARC layer 228 may include polysulfones, polyureas, polyurea sulfones, polyacrylates, poly(vinyl pyridine), or a silicon-containing polymer. The first BARC layer 228 may be deposited over the workpiece 200 using spin-on coating or FCVD. According to the present disclosure, at least a portion of the hard mask layer 226 over the dielectric fin 214 remains covered by the patterned first BARC layer 228. This arrangement allows the subsequently formed patterned hard mask layer 226 and the dielectric fin to form a protection enclosure of the cap layer 224 in the p-type device region 20P. In the depicted embodiment, a portion of the patterned first BARC layer 228 remains disposed over a portion of the hard mask layer 226 over the n-type device region 20N. Referring then to FIGS. 13 and 14, the patterned first BARC layer 228 is applied as an etch mask to etch the hard mask layer 226 to form a patterned hard mask layer 226. In the depicted embodiment, a portion of the patterned hard mask layer 226 is disposed on the portion of the cap layer 224 over the n-type device region 20N. As shown in FIG. 14, after the selective removal of the hard mask layer 226 over the n-type device region 20N, the protection layer 222 on the sidewalls of the gate spacer layers 216 and the cap layer 224 in the n-type device region 20N are exposed.

Figure 15:
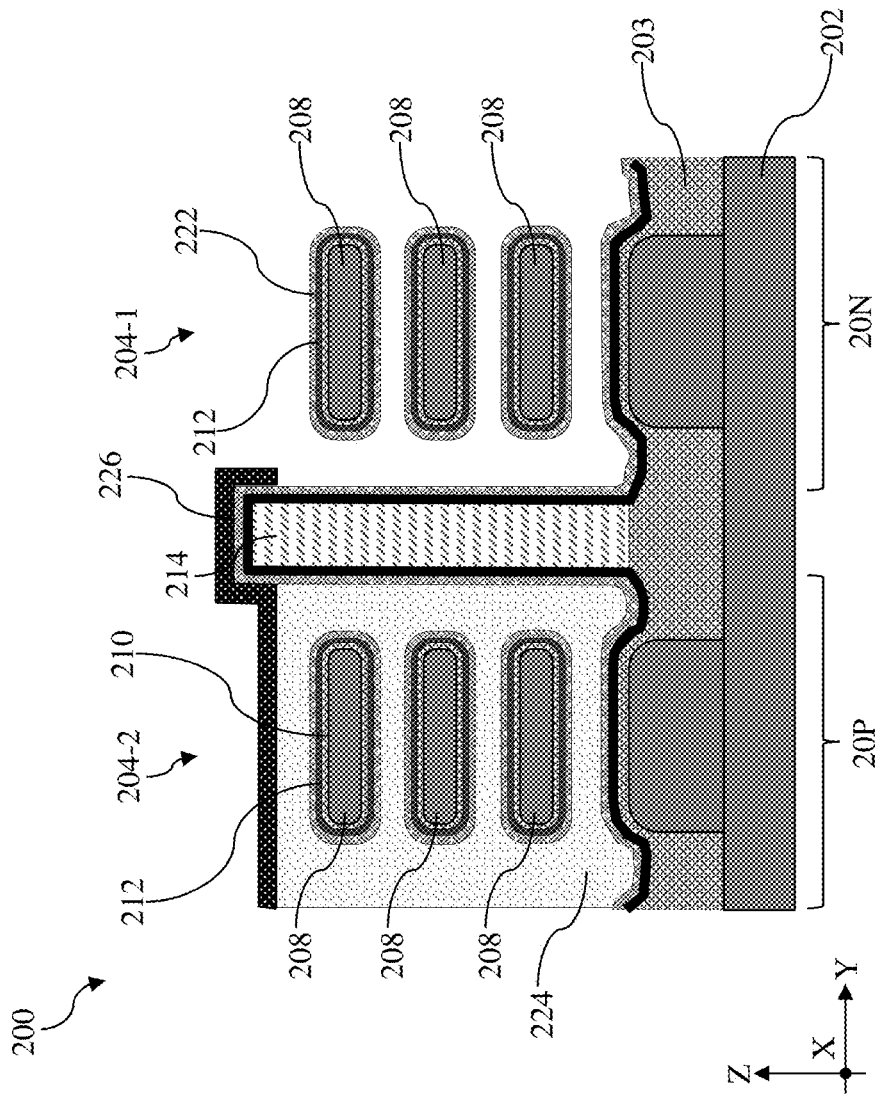
Figure 16:
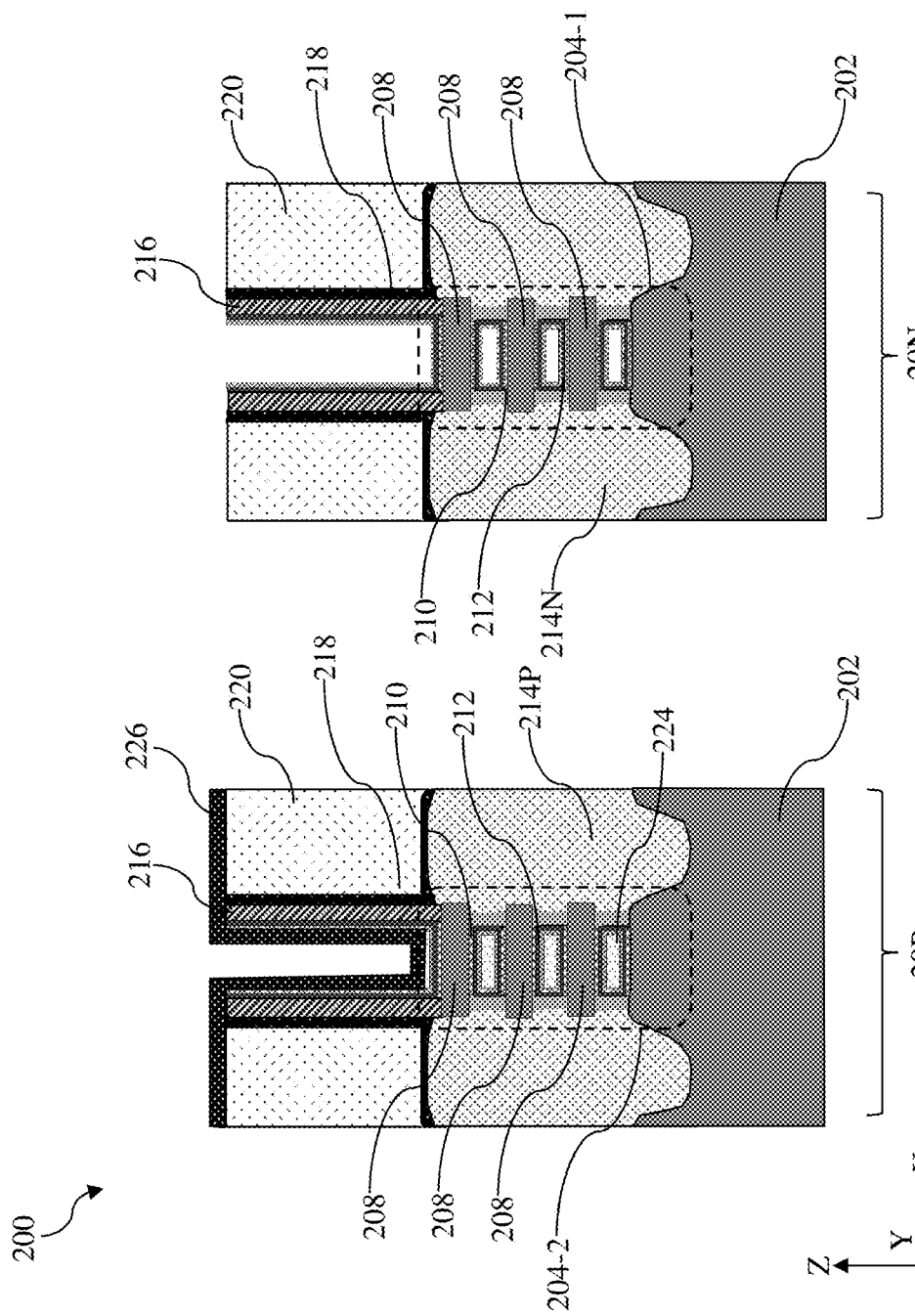

Referring to FIGS. 1, 15 and 16, method 100 includes a block 114 where the cap layer 224 in the n-type device region 20N is removed. With the formation of the patterned hard mask layer 226 at block 112, the cap layer 224 over the n-type device region 20N is selectively removed. In some embodiments, the selective removal of the cap layer 224 over the n-type device region 20N is performed using a selective wet etch or a selective dry etch that is selective to the cap layer 224 and etches the protection layer 222 at a much slower rate. An example selective wet etch process at block 114 may include use of ethylenediamine pyrocatechol (EDP), tetramethylammonium hydroxide (TMAH), nitric acid ($HNO_3$), hydrofluoric acid (HF), ammonia ($NH_3$), ammonium fluoride ($NH_4F$) or a suitable wet etchant. An example selective dry etch process at block 114 may include sulfur hexafluoride ($SF_6$), hydrogen ($H_2$), ammonia ($NH_3$), methane ($CH_4$), hydrogen bromide (HBr), hydrogen fluoride (HF), carbon tetrafluoride ($CF_4$), or a mixture thereof. As shown in FIGS. 15 and 16, the selective removal of the cap layer 224 over the n-type device region 20N exposes the protection layer 222 over the n-type device region 20N. After the removal of the cap layer 224, the patterned first BARC layer 228 is removed by ashing or selective etching.

Figure 17:
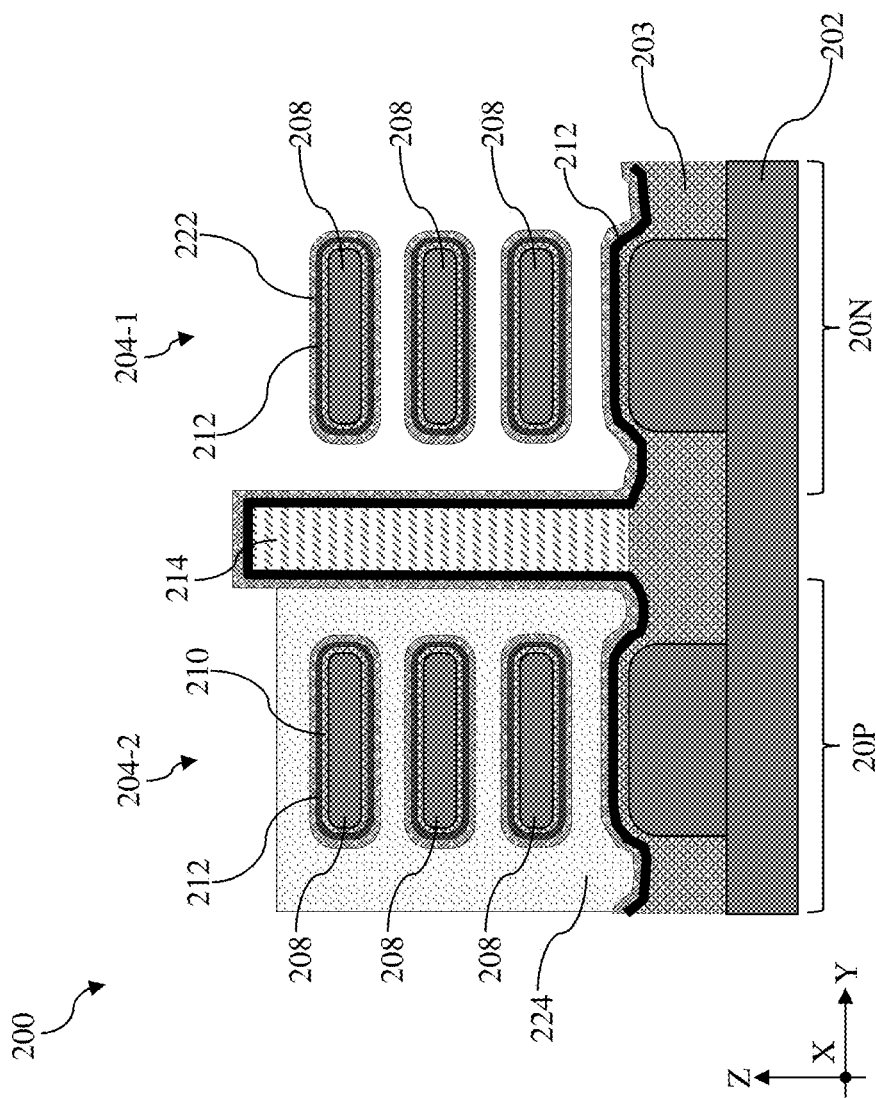
Figure 18:
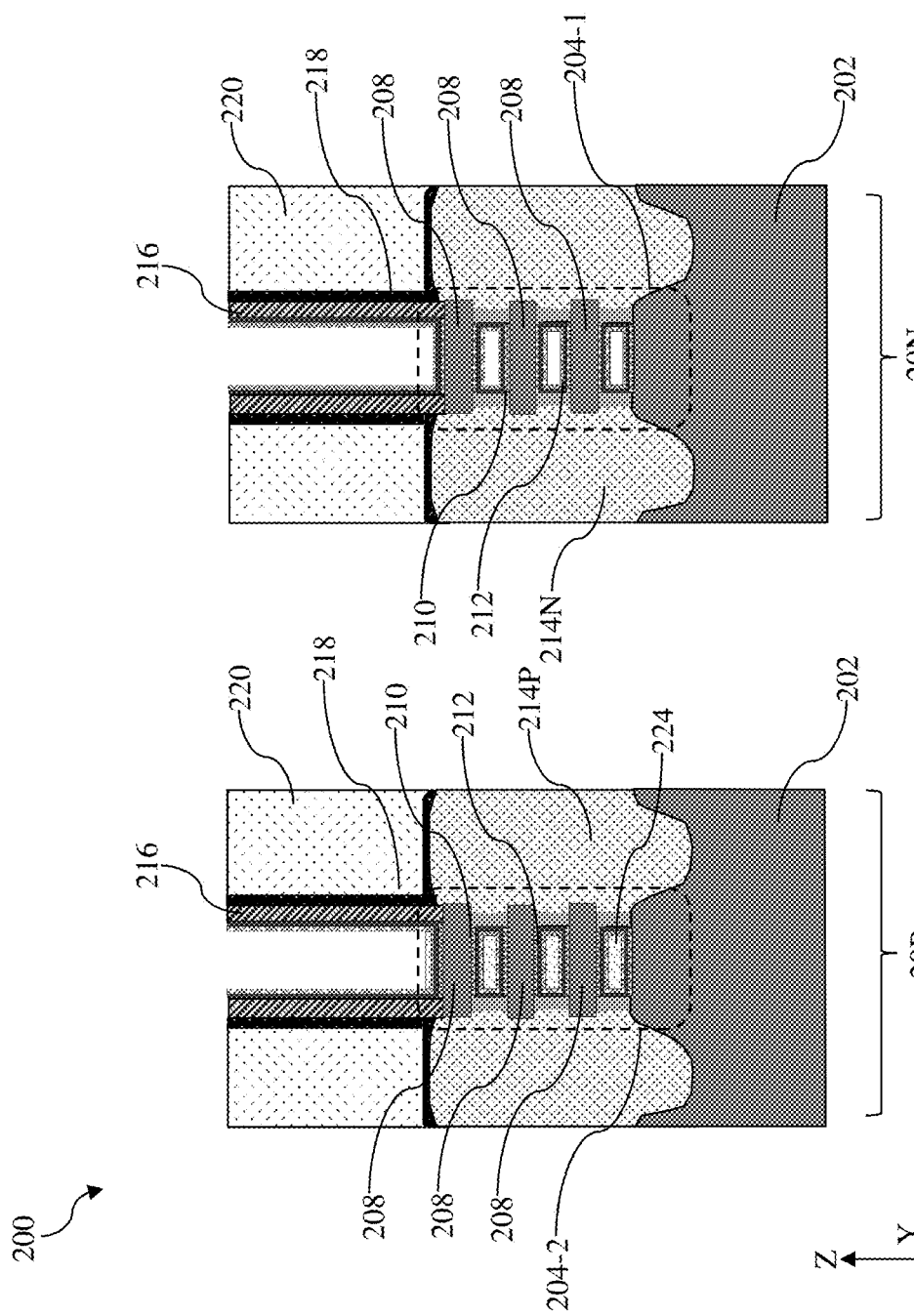

Referring to FIGS. 1, 17 and 18, method 100 includes a block 116 where the patterned hard mask layer 226 is removed. After the selective removal of the cap layer 224 over the n-type device region 20N, the patterned hard mask layer 226 over the dielectric fin 214 and the p-type device region 20P is selectively removed by selective etching. Because the hard mask layer 226 is formed of metal oxide, the selective etch at block 116 may be performed using a dry etch or a wet etch that is selective to metal oxide. An example selective wet etch process may include use of hydrofluoric acid, ammonium fluoride, RCA SC-1 (ammonia, hydrogen peroxide and water), RCA SC-2 (hydrochloric acid and hydrogen peroxide), or a combination thereof. An example selective dry etch process may include use of oxygen, a fluorine-containing gas (e.g., $CF_4$, $SF_6$, $CH_2F_2$, $CHF_3$, and/or $C_2F_6$), or a combination thereof.

Figure 19:
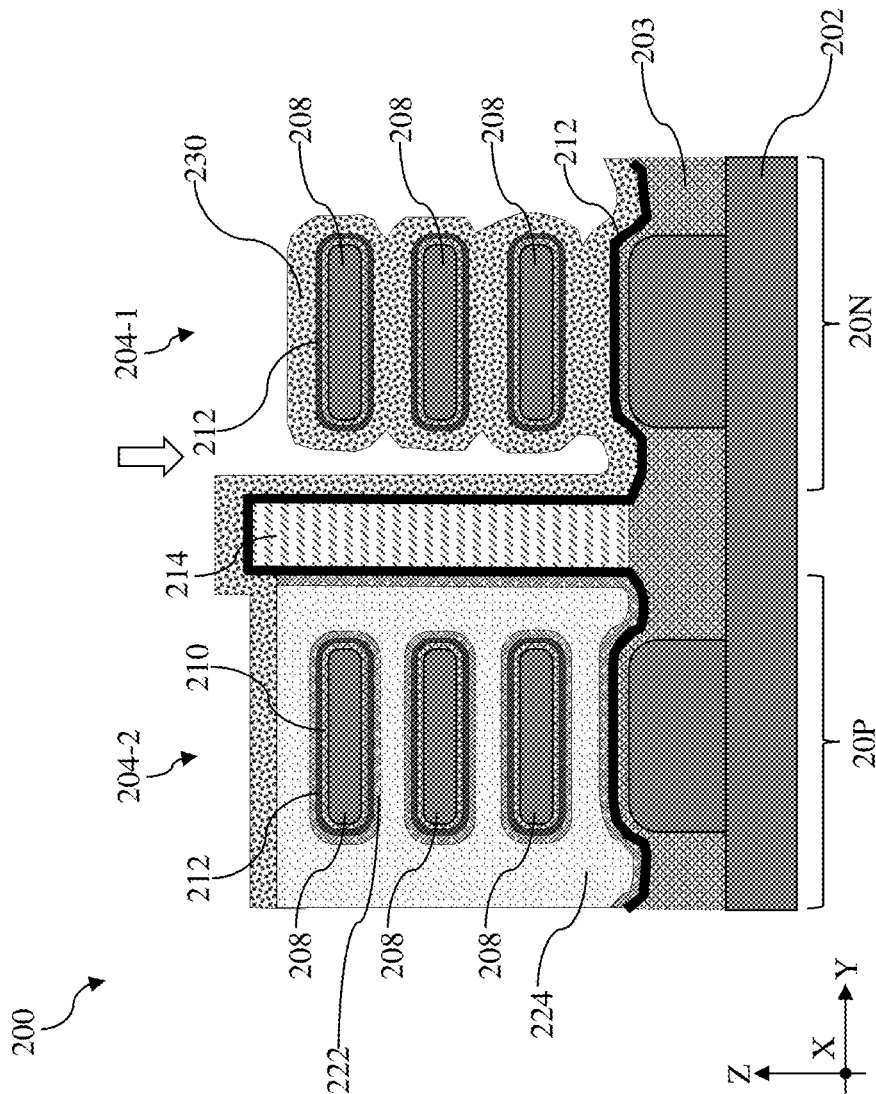
Figure 20:
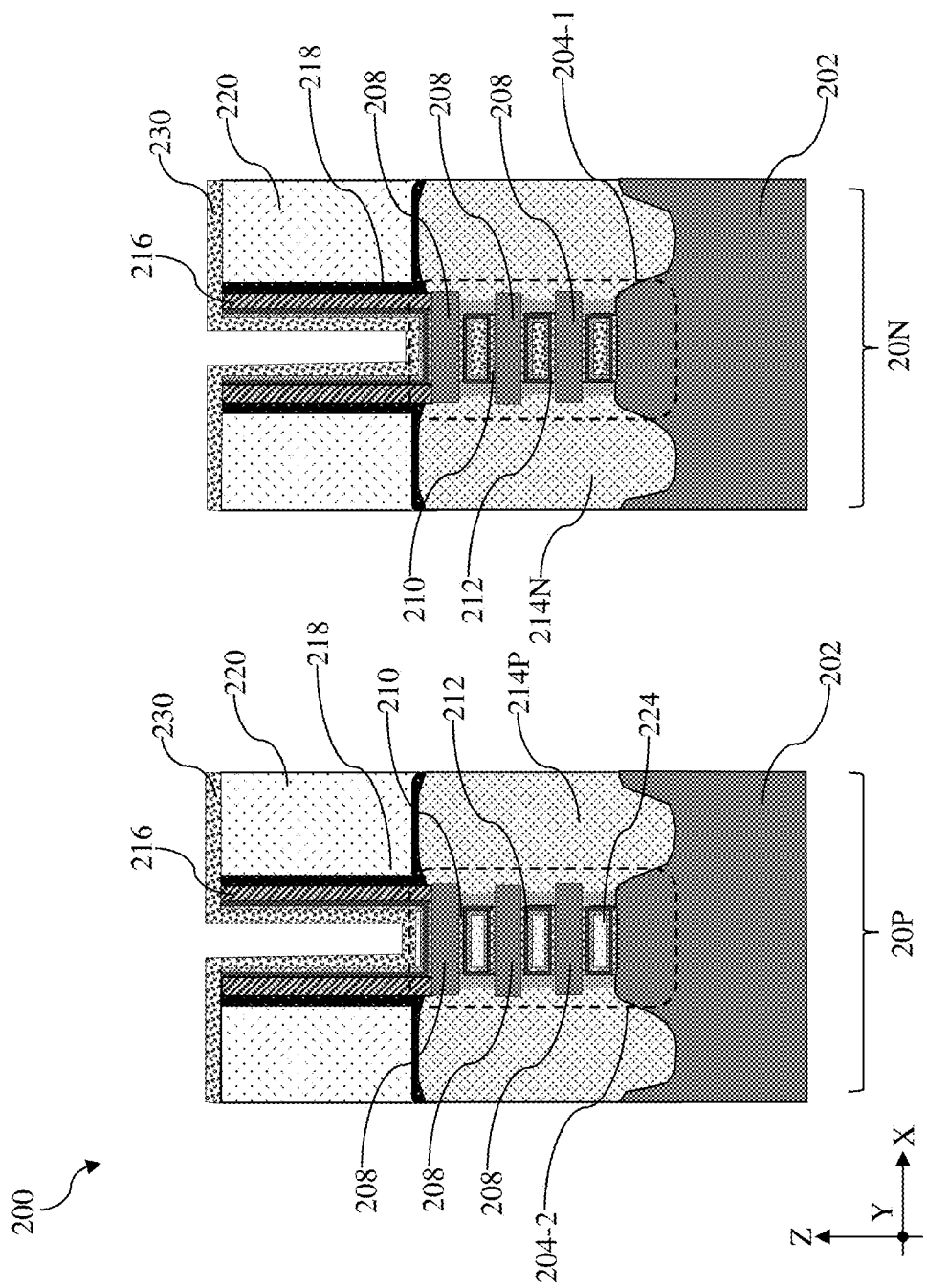

Referring to FIGS. 1, 19 and 20, method 100 includes a block 118 where the protection layer 222 not covered by the cap layer 224 is removed. As shown in FIGS. 19 and 20, the exposed protection layer 222 is removed by a selective dry etch or a selective wet etch. An example selective wet etch to remove the protection layer 222 may include a mixture of nitric acid and hydrofluoric acid, RCA SC-1 (ammonia, hydrogen peroxide and water), RCA SC-2 (hydrochloric acid and hydrogen peroxide), or buffered hydrofluoric acid (a mixture of hydrofluoric acid and ammonium fluoride). The removal of the exposed protection layer 222 may expose the gate dielectric layer 212 over the dielectric fin 214 and the channel members 208 in the n-type device region 20N.

Referring to FIGS. 1, 19 and 20, method 100 includes a block 120 where a first work function metal layer 230 is deposited. After the removal of the exposed protection layer 222, block 120 deposits the first work function metal layer 230 over the workpiece 200. In some embodiments, the first work function metal layer 230 may be an n-type work function metal layer and may include titanium (Ti), aluminum (Al), titanium aluminide (TiAl), titanium aluminum carbide (TiAlC), tantalum aluminum carbide (TaAlC), titanium aluminum nitride (TiAlN), tantalum silicon aluminum (TaSiAl), tantalum silicon carbide (TaSiC), tantalum silicide (TaC), or hafnium carbide (HfC). As shown in FIGS. 19 and 20, the deposited first work function metal layer 230 comes in direct contact with the gate dielectric layer 212 on the dielectric fin 214 and around the channel members 208 in the n-type device region 20N. It is noted that the first work function metal layer 230 is allowed to fill in the space between the dielectric fin 214 and the channel members 208 in the n-type device region 20N, as indicated by the hollow arrow. The space between the dielectric fin 214 and the channel members 208 may be referred to as an end cap space. Satisfactory metal filling in the end cap space is important to gate structure integrity, threshold voltage, and gate resistance.

In some embodiments shown in FIG. 19, the first work function metal layer 230 deposited between adjacent channel members 208 in the n-type device region 20N is allowed to merge, thereby filling the member-to-member spaces. In some alternative embodiments shown in FIG. 28, the first work function metal layer 230 does not merge to seal the member-to-member spaces and the subsequently deposited second work function metal layer 234 (to be described below) is allowed to enter the member-to-member spaces.

Figure 21:
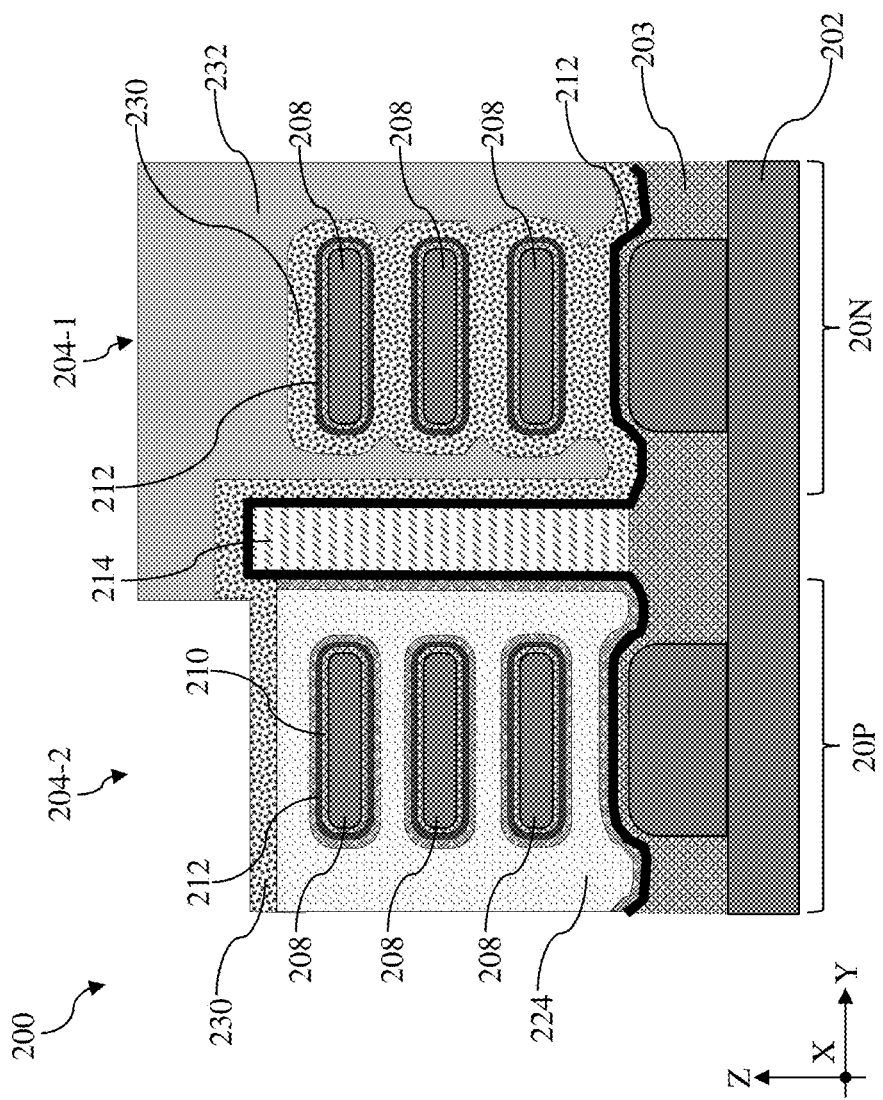
Figure 22:
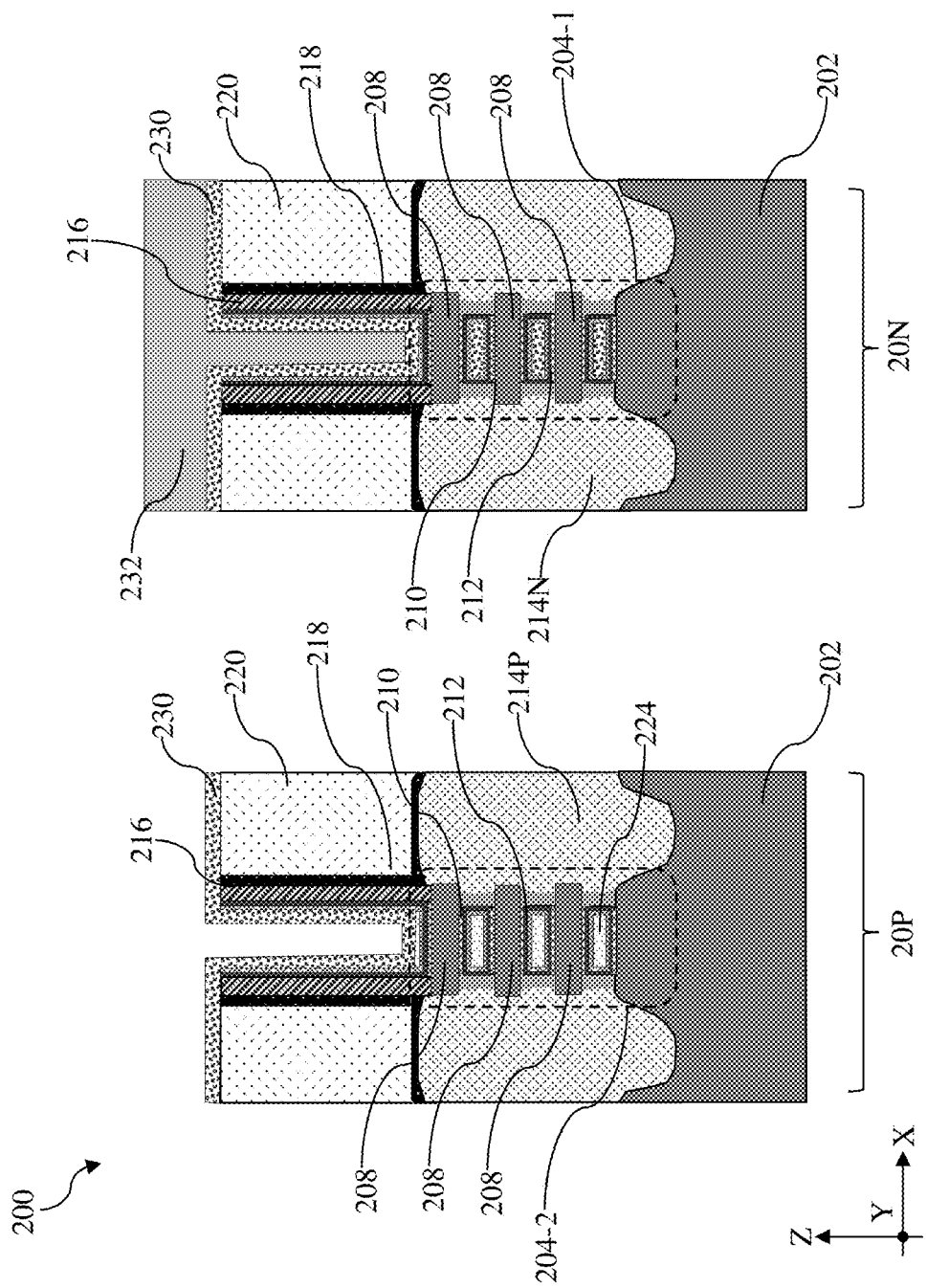

Referring to FIGS. 1, 21, 22, 23, and 24, method 100 includes a block 122 where the first work function metal layer 230, the cap layer 224, and the protection layer 222 over a p-type device region 20P are selectively removed. Operations at block 122 may include formation of a patterned second BARC layer 232 (shown in FIGS. 21 and 22) and etching of the first work function metal layer 230, the cap layer 224 using the patterned second BARC layer 232 as an etch mask (shown in FIGS. 23 and 24), and removal of the patterned second BARC layer 232 (shown in FIGS. 23 and 24). In an example process, the second BARC layer 232 is first deposited on the first work function metal layer 230 on the workpiece 200 and then the second BARC layer 232 is patterned using photolithography techniques to form the patterned second BARC layer 232, as shown in FIGS. 21 and 22. In some embodiments represented in FIG. 21, the patterned second BARC layer 232 covers and protects the first work function metal layer 230 over the n-type device region 20N as well as the first work function metal layer 230 on the top surface and sidewall of the dielectric fin 214. As shown in FIGS. 21 and 22, the patterned second BARC layer 232 exposes the first work function metal layer 230 over the p-type device region 20P.

Figure 23:
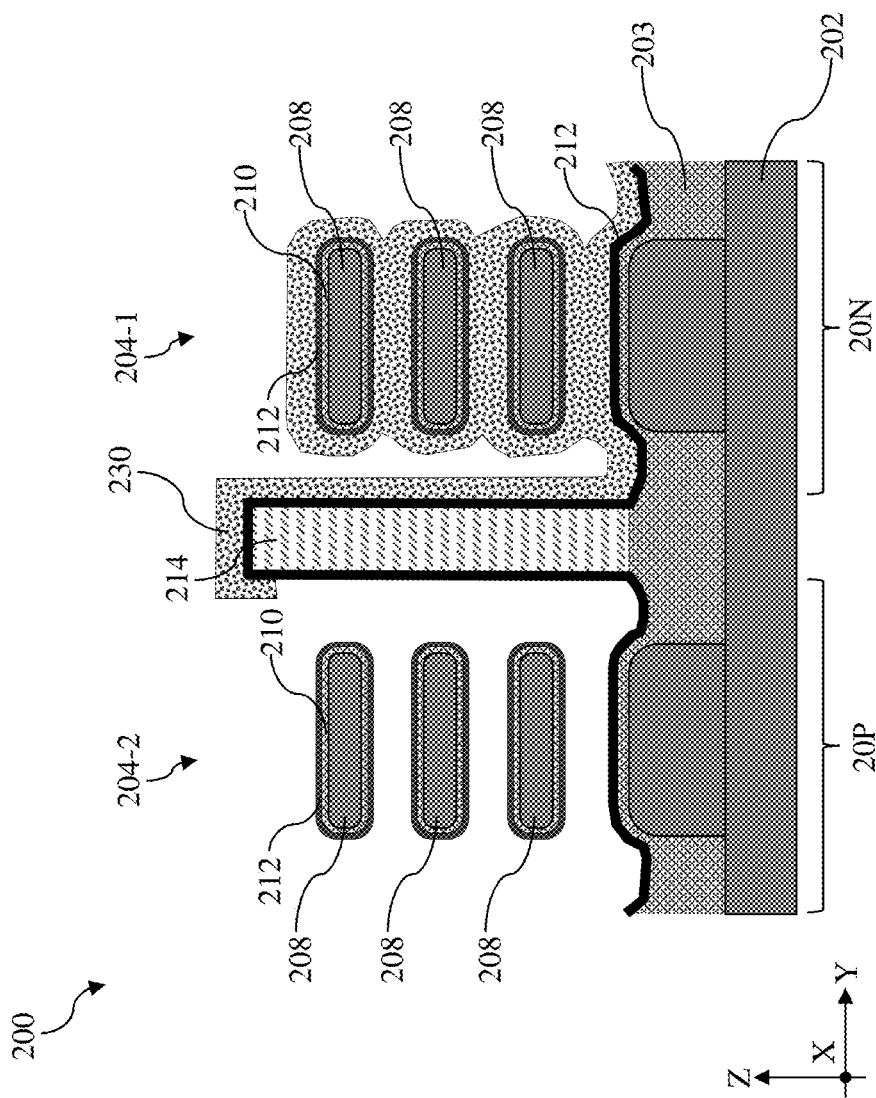
Figure 24:
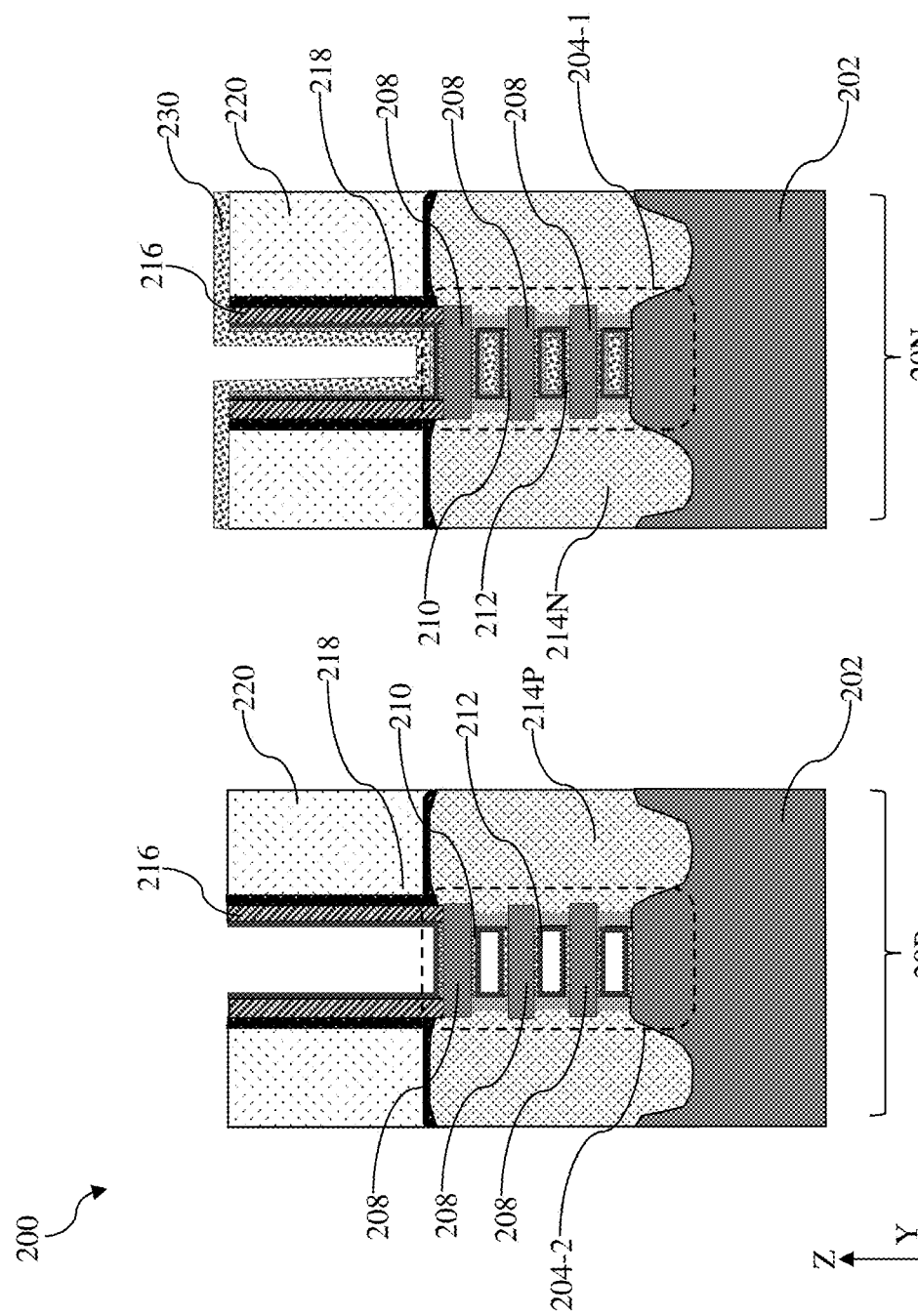

Reference is now made to FIGS. 23 and 24. Block 122 also includes etching the first work function metal layer 230 and the cap layer 224 over the p-type device region 20P using the second patterned BARC layer 232 as an etch mask. Block 122 additionally includes removal of the patterned second BARC layer 232 and removal of the protection layer 222 over the p-type device region 20P. In some embodiments, the etching of the first work function metal layer 230, the etching of the cap layer 224, the etching of the protection layer 222 are carried out in different etch processes. For example, the first work function metal layer 230 may be etched using a selective wet etch process that implements phosphoric acid, acetic acid, nitric acid, RCA SC-1 (ammonia, hydrogen peroxide and water), or RCA SC-2 (hydrochloric acid and hydrogen peroxide) or a selective dry etch process that implements chlorine, carbon tetrachloride, silicon tetrachloride, boron chloride. The selective etching of the cap layer 224 may be performed using a selective wet etch process that implements ethylenediamine pyrocatechol (EDP), tetramethylammonium hydroxide (TMAH), nitric acid ($HNO_3$), hydrofluoric acid (HF), ammonia ($NH_3$), ammonium fluoride ($NH_4F$), ammonium hydroxide ($NH_4OH$), hydrogen peroxide ($H_2O_2$), diluted hydrofluoric acid (DHF), or a suitable wet etchant. As shown in FIG. 23, the wet etching of the cap layer 224 is isotropic and may undercut the patterned second BARC layer 232 as well as the underlying first work function metal layer 230. The selective removal of the cap layer 224 in confined spaces introduces the self-alignment element to method 100. Even when the patterning of the patterned second BARC layer 232 is less than ideal due to unsatisfactory mask overlay, the cap layer 224 may still be satisfactorily removed as long as a portion of the cap layer 224 is exposed.

After the removal of the cap layer 224 over the p-type device region 20P, the patterned second BARC layer 232 is removed by ashing or selective etching. After the removal of the patterned second BARC layer 232, the protection layer 222 over the p-type device region 20P is selectively removed using a selective wet etch process. An example selective wet etch process to remove the protection layer 222 may include a mixture of nitric acid and hydrofluoric acid, RCA SC-1 (ammonia, hydrogen peroxide and water), RCA SC-2 (hydrochloric acid and hydrogen peroxide), or buffered hydrofluoric acid (a mixture of hydrofluoric acid and ammonium fluoride). The removal of the exposed protection layer 222 at block 122 may expose the gate dielectric layer 212 over a sidewall of the dielectric fin 214 and the channel members 208 in the p-type device region 20P.

Alternatively, after the first work function metal layer 230 is patterned with the help of the patterned second BARC layer 232, the patterned second BARC layer 232 may be removed. The patterned first work function metal layer 230 may function as an etch mask in removing the cap layer 224 in the p-type device region.

Figure 25:
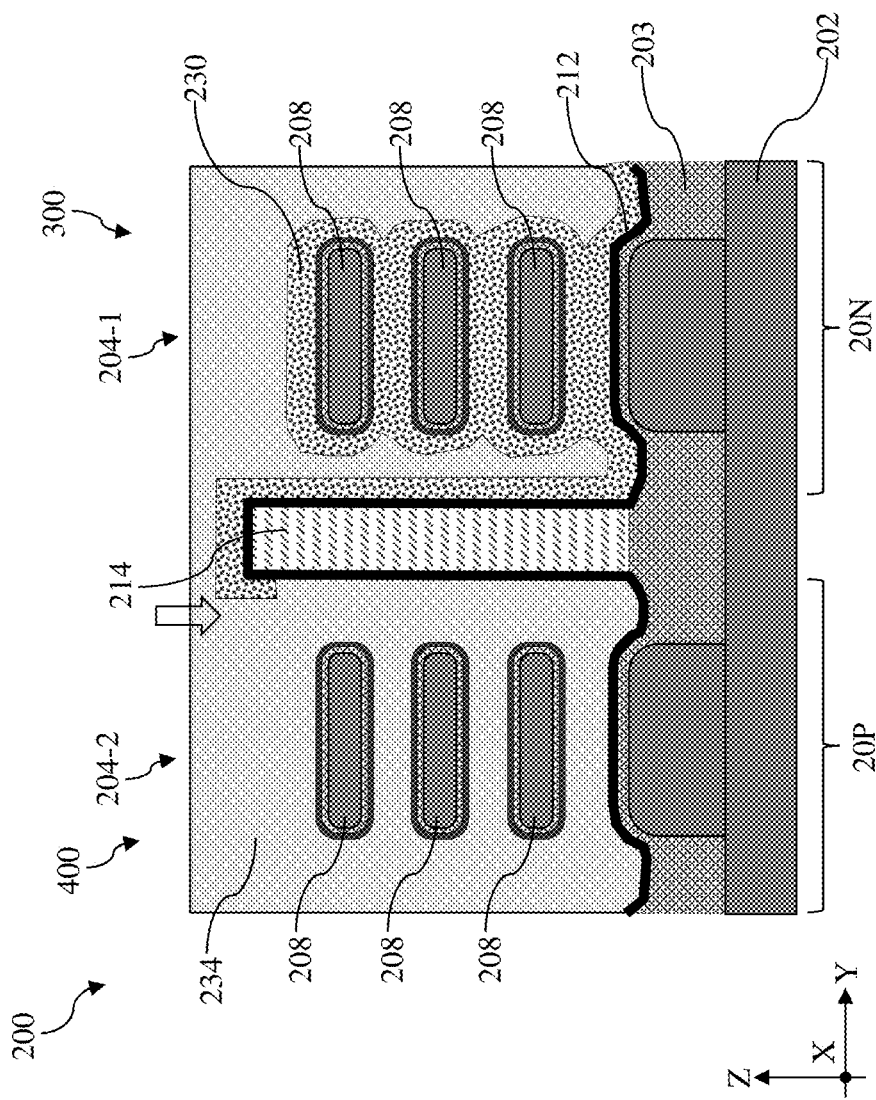
Figure 26:
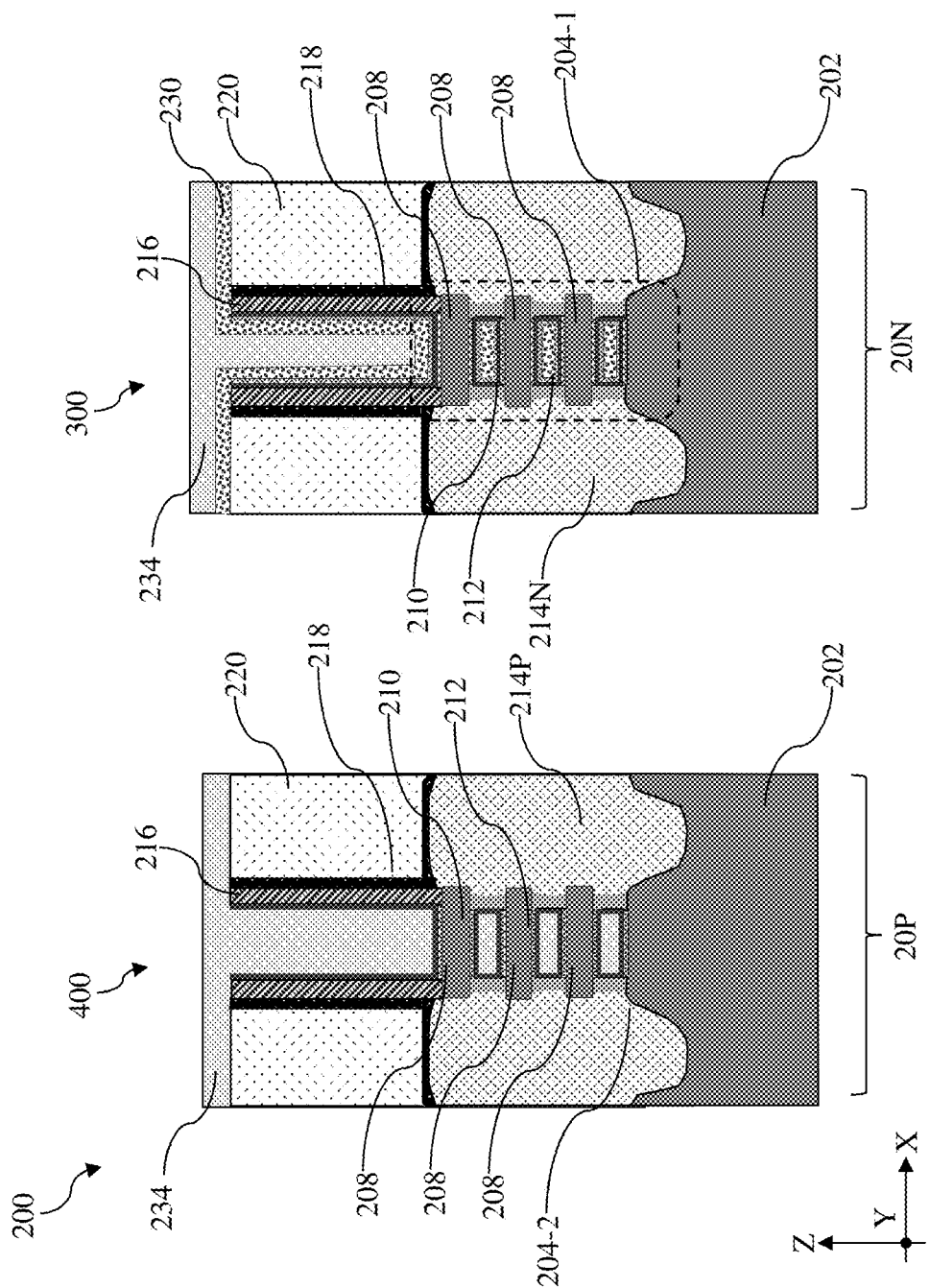

Referring to FIGS. 1, 25 and 26, method 100 includes a block 124 where a second work function metal layer 234 is deposited over the workpiece 200. After the removal of the protection layer 222 over the p-type device region 20P, block 124 deposits the second work function metal layer 234 over the workpiece 200. In some embodiments, the second work function metal layer 234 may be a p-type work function metal layer and may include cobalt (Co), titanium nitride (TiN), tungsten carbonitride (WCN), titanium silicon nitride (TiSiN), tantalum nitride (TaN), molybdenum (Mo), or a combination thereof. As shown in FIGS. 25 and 26, the deposited second work function metal layer 234 wraps around each of the channel members 208 in the p-type device region 20P and is disposed on the first work function metal layer 230 in the n-type device region 20N. In the depicted embodiments, the second work function metal layer 234 fill the end cap space between the channel members 208 in the p-type device region 20P and the dielectric fin 214. The second work function metal layer 234 also may extend into the end cap space between the channel members 208 in the n-type device region 20N and the dielectric fin 214. It is noted that the top surface of the dielectric fin 214 is covered by the first work function metal layer 230 and is spaced apart from the second work function metal layer 234 by the first work function metal layer 230. In some embodiments, a top surface of the dielectric fin 214 may not be fully covered by the first work function metal layer 230. The second work function metal layer 234 comes in direct contact with the gate dielectric layer 212 on the sidewall of the dielectric fin 214 and around the channel members 208 in the p-type device region 20P. FIGS. 25 and 26 illustrate an example where the first work function metal layer 230 and the second work function metal layer 234 are not divided into two separate gate structures by the dielectric fin 214 or a gate cut feature. While not explicitly shown in the figures, after the deposition of the second work function metal layer 234, the workpiece 200 may be subject to a planarization process, such as a chemical mechanical polishing (CMP) process, to provide a planar top surface. At the conclusion of the operations at block 124, an n-type MBC transistor 300 is formed over the n-type device region 20N and a p-type MBC transistor 400 is formed over the p-type device region 20P. Because the first work function metal layer 230 and the second work function metal layer 234 include a connecting portion spanning over the dielectric fin 214, they collectively form a common gate structure that controls both the n-type MBC transistor 300 and the p-type MBC transistor 400. As described elsewhere in the present disclosure, further processes may be performed to separate the common gate structure into different gate structures (or different gate segments).

Figure 29:
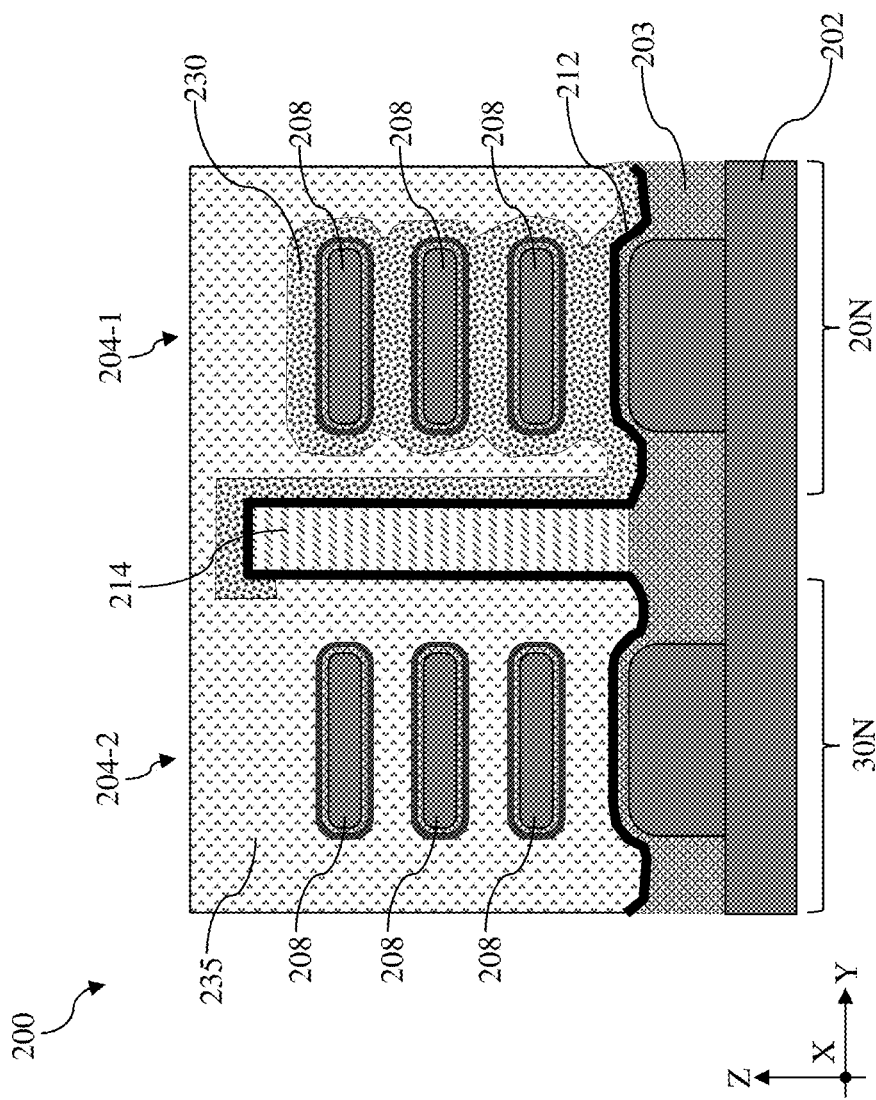

In some alternative embodiments shown in FIG. 29, instead of the second work function metal layer 234, a third work function metal layer 235 is deposited at block 124. In these alternative embodiments, for ease of reference, the n-type device region 20N may be referred to as a first n-type device region 20N. In FIG. 29, the p-type device region 20P is replaced with a second n-type device region 30N. Like the first n-type device region 20N, the second n-type device region 30N may also be disposed over a p-type well. The third work function metal layer 235 is an n-type work function metal layer but is different from the first work function metal layer 230 in terms of composition. For example, the first work function metal layer 230 may include titanium aluminum (TiAl) while the third work function metal layer 235 includes titanium (Ti). In these alternative embodiments, the n-type MBC transistor formed in the first n-type device region 20N and the n-type MBC transistor formed in the second n-type device region 30N may have different threshold voltages.

Figure 30:
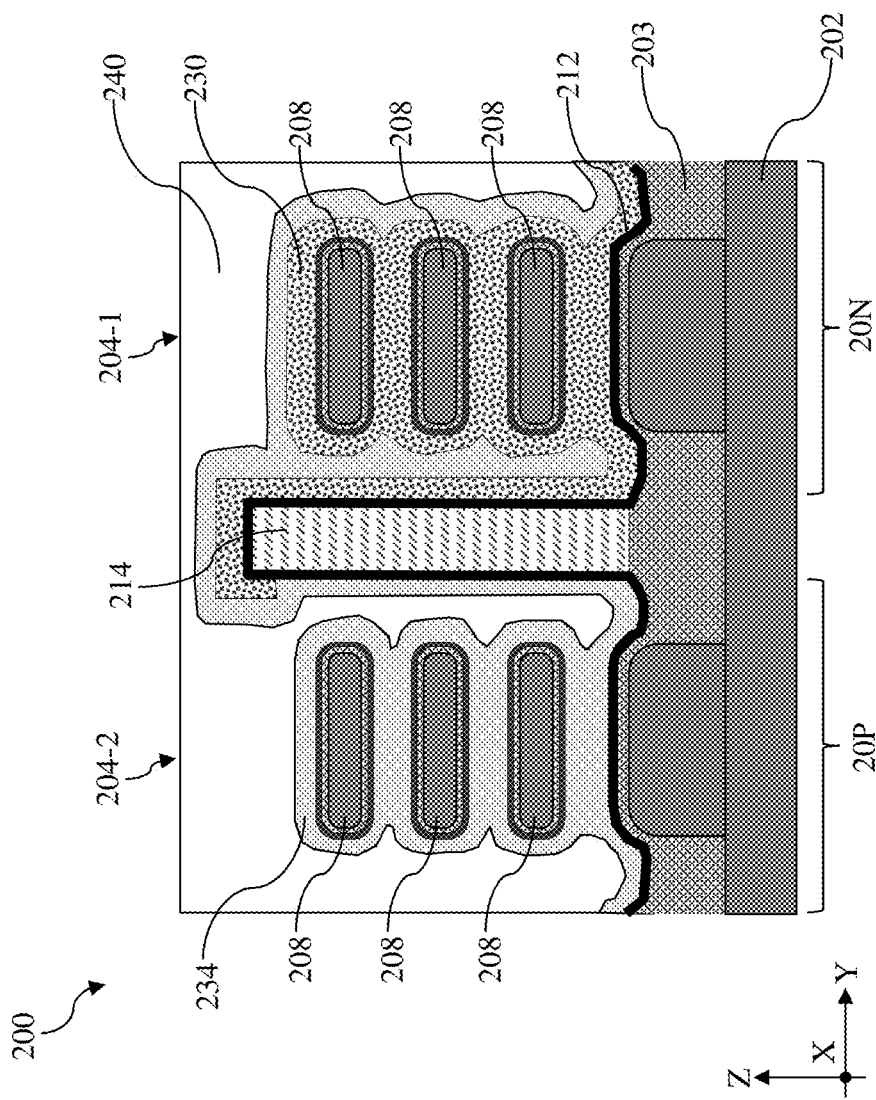

In still some alternative embodiments shown in FIG. 30, the second work function metal layer 234 is only conformally deposited over the workpiece 200 but does not completely fill the spaces around the dielectric fin 214. In these alternative embodiments, method 100 may include further processes to deposit a metal fill layer 240 over the second work function metal layer 234.

Referring to FIG. 1, method 100 includes a block 126 where further processes are performed. Such further processes may include, for example, deposition of a metal fill layer 240 (shown in FIG. 30), etching back of the second work function metal layer 234 and the first work function metal layer 230 (shown in FIG. 31), or formation of a gate cut feature 244 over the dielectric fin 214 (shown in FIG. 32). Referring first to FIG. 30, in some alternative embodiment, the second work function metal layer 234 does not fill the gate opening defined between gate spacer layers. In those alternative embodiments, method 100 may include a metal fill process to deposit a metal fill layer 240 over the second work function metal layer 234. As illustrated in FIG. 30, the metal fill layer 240 may extend into the end cap space between the channel members 208 over the p-type device region 20P and the dielectric fin 214. The metal fill layer 240 may include tungsten (W), ruthenium (Ru), cobalt (Co) or copper (Cu). In one embodiment, the metal fill layer 240 may include tungsten (W). While not explicitly shown in the figures, after the deposition of the metal fill layer 240, the workpiece 200 may be subject to a planarization process, such as a chemical mechanical polishing (CMP) process, to provide a planar top surface.

Figure 31:
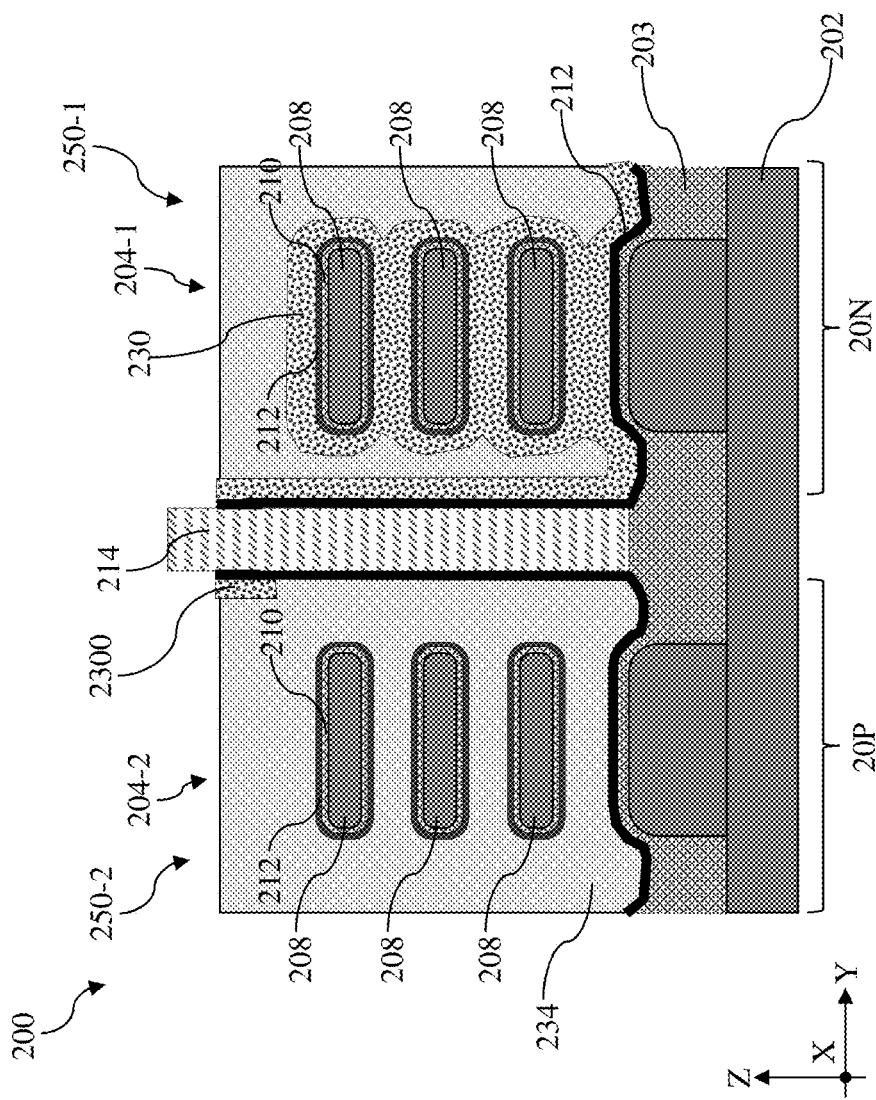

Referring then to FIG. 31, when the first active region 204-1 and the second active region 204-2 are to be separated, the second work function metal layer 234, the first work function metal layer 230, and the gate dielectric layer 212 may be etched back using a dry etch process until they are separated into a first gate structure 250-1 over the n-type device region 20N and a second gate structure 250-2 over the p-type device region 20P. The dry etch process may include use of oxygen, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 31, the etching back of the first work function metal layer 230 may leave behind a first work function metal feature 2300 as part of the second gate structure 250-2. The first work function metal feature 2300 is in contact with the gate dielectric layer 212 but is spaced apart from the dielectric fin 214 by the gate dielectric layer 212.

Figure 32:
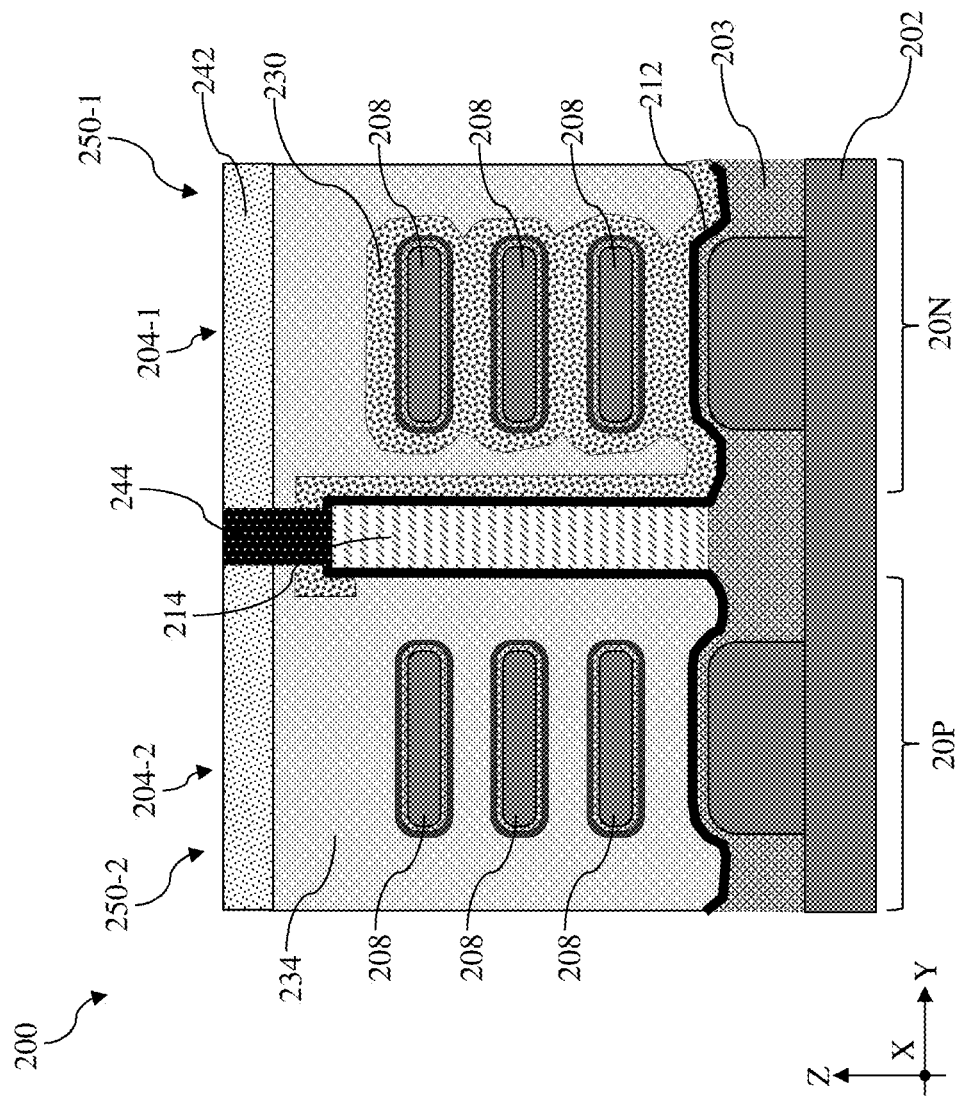

Reference is now made to FIG. 32. When the first active region 204-1 and the second active region 204-2 are to be separated, a gate cut feature 244 may be formed over the dielectric fin 214. The gate cut feature 244 severs the connecting portion of the second work function metal layer 234 and the first work function metal layer 230 and separate them into a first gate structure 250-1 and the second gate structure 250-2. In an example process, after the planarization of the second work function metal layer 234, a dielectric layer 242 may be deposited over the second work function metal layer 234. A gate cut opening is then formed through the dielectric layer 242, the second work function metal layer 234, the first work function metal layer 230, and the gate dielectric layer 212 to expose the top surface of the dielectric fin 214. Thereafter, a dielectric material is deposited into the gate cut opening to form the gate cut feature 244. In some embodiments, the composition and the formation process of the dielectric layer 242 may be similar to those of the ILD layer 220. The gate cut feature 244 may include a dielectric material, such as silicon oxide, silicon oxynitride, silicon nitride, silicon oxycarbonitride, hafnium oxide, zirconium oxide, or aluminum oxide.

FIG. 33 illustrates an alternative embodiment where the workpiece 200 includes the first active region 204-1 and a third active region 204-3. Unlike the first active region 204-1 and the second active region 204-2 that includes a vertical stack of channel members 208, the third active region 204-3 includes a fin element 2082 to serve as a channel region of a FinFET. The fin element 2082 may be formed of silicon and may extend from the substrate 202. The semiconductor device 200 in FIG. 33 may be referred to a hybrid device as it includes at least one n-type MBC transistor 300 and at least one p-type FinFET 500. Except for the fact that the third active region 204-3 does not have a vertical stack of channel members and does not have member-to-member spaces, method 100 may be used to form the semiconductor device shown in FIG. 33.

Based on the above discussions, it can be seen that the present disclosure offers advantages over existing processes. It is understood, however, that other embodiments may offer additional advantages, and not all advantages are necessarily disclosed herein, and that no particular advantage is required for all embodiments. For example, the processes disclosed in the present disclosure deposits a protection layer over the active region, a cap layer over the protection layer, and a hard mask layer over the cap layer. The protection layer serves as an etch retardation layer. The cap layer serves as a sacrificial layer that may be selectively removed without substantially damaging the protection layer. In conjunction with a dielectric fin disposed between two adjacent active regions, this tri-layer arrangement allows self-aligned and controlled removal of the cap layer over one active region even when the patterning of the hard mask layer is less than satisfactory. The processes of the present disclosure may ease mask overlay requirement and improve process yield.

In one exemplary aspect, the present disclosure is directed to a semiconductor structure. The semiconductor structure includes at least one first semiconductor element and at least one second semiconductor element over a substrate, a dielectric fin disposed between the at least one first semiconductor element and the at least one second semiconductor element, a first work function metal layer wrapping around each of the at least one first semiconductor element, the first work function metal layer extending continuously from the at least one first semiconductor element to a top surface of the dielectric fin, and a second work function metal layer disposed over the at least one second semiconductor element and the first work function metal layer.

In some embodiments, the semiconductor structure may further include a gate dielectric layer disposed over surfaces of the at least one first semiconductor element and the at least one second semiconductor element. The second work function metal layer is in contact with the gate dielectric layer disposed on the at least one second semiconductor element, and the second work function metal layer is spaced apart from the gate dielectric layer disposed on the at least one first semiconductor element by the first work function metal layer. In some embodiments, the gate dielectric layer is disposed over sidewalls and the top surface of the dielectric fin. In some implementations, the at least one first semiconductor element includes a first plurality of channel members that are stacked one over another and the at least one second semiconductor element includes a second plurality of channel members that are stacked one over another. In some instances, the at least one first semiconductor element includes a plurality of channel members that are stacked one over another and the at least one second semiconductor element includes a semiconductor fin rising from the substrate. In some implementations, the first work function metal layer is an n-type work function metal layer and the second work function metal layer is a p-type work function metal layer. In some embodiments, the first work function metal layer includes titanium (Ti), aluminum (Al), titanium aluminum (TiAl), titanium aluminum carbide (TiAlC), tantalum aluminum carbide (TaAlC), or titanium aluminum nitride (TiAlN) and the second work function metal layer includes cobalt (Co), titanium nitride (TiN), or tungsten carbonitride (WCN). In some instances, the semiconductor structure may further include a gate cut feature disposed over the dielectric fin. The gate cut feature divides the first work function metal layer and the second work function metal layer into a first gate segment disposed over the at least one first semiconductor element and a second gate segment disposed over the at least one second semiconductor element. In some instances, the gate cut feature extends through the first work function metal layer such that the second gate segment includes a portion of the first work function metal layer.

In another exemplary aspect, the present disclosure is directed to a semiconductor structure. The semiconductor structure includes a first plurality of channel members disposed over a first device region of a substrate, a second plurality of channel members disposed over a second device region of the substrate, a dielectric fin disposed between the first plurality of channel members and the second plurality of channel members along a first direction, and a gate structure disposed over the dielectric fin and wrapping around each of the first plurality of channel members and each of the second plurality of channel members. The gate structure includes a first work function metal layer extending continuously from a top surface of the dielectric fin to surfaces of the first plurality of channel member, and a second work function metal layer wrapping around each of the second plurality of channel members and disposed over the first work function metal layer.

In some embodiments, the first plurality of channel members are sandwiched between two n-type source/drain features along a second direction perpendicular to the first direction and the second plurality of channel members are sandwiched between two p-type source/drain features along the second direction. In some implementations, the first work function metal layer does not extend between the second work function metal layer and the second plurality of channel members. In some instances, the second work function metal layer extends between adjacent ones of the first plurality of channel members. In some embodiments, the first work function metal layer includes titanium (Ti), aluminum (Al), titanium aluminum (TiAl), titanium aluminum carbide (TiAlC), tantalum aluminum carbide (TaAlC), or titanium aluminum nitride (TiAlN) and the second work function metal layer includes cobalt (Co), titanium nitride (TiN), or tungsten carbonitride (WCN).

In yet another exemplary aspect, the present disclosure is directed to a method. The method includes receiving a workpiece that includes a first active region and a second active region, and a dielectric fin disposed between the first active region and the second active region, forming a gate dielectric layer over the first active region, the dielectric fin and the second active region, after the forming of the gate dielectric layer, depositing a cap layer over the dielectric fin, the first active region and the second active region, etching back the cap layer until the dielectric fin separates the cap layer into a first portion over the first active region and a second portion over the second active region, after the etching back, selectively removing the first portion of the cap layer over the first active region, forming a first metal layer over the first active region, the dielectric fin and the cap layer over the second active region, selectively removing the first metal layer and the cap layer over the second active region, and forming a second metal layer over the second active region and the first metal layer over the first active region.

In some embodiments, the cap layer includes silicon. In some implementations, the method may further include before the depositing of the cap layer, depositing a protection layer over the first active region, the second active region, and the dielectric fin. In some embodiments, the protection layer includes titanium nitride. In some instances, after the selectively removing of the first metal layer and the cap layer over the second active region, a portion of the first metal layer remains disposed over a top surface of the dielectric fin. In some instances, after the forming of the second metal layer over the second active region, a top surface of the dielectric fin is spaced apart from the second metal layer by the first metal layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a first base portion and a second base portion disposed over the substrate;
   a first plurality of nanostructures disposed over the first base portion;
   a second plurality of nanostructures disposed over the second base portion;
   a dielectric fin disposed between the first plurality of nanostructures and the second plurality of nanostructures, the dielectric fin comprising a first sidewall facing toward the first plurality of nanostructures, a second sidewall facing toward the second plurality of nanostructures, and a top surface;
   a gate dielectric layer disposed along surfaces of each of the first plurality of nanostructure, each of the second plurality of nanostructures, the top surface of the dielectric fin, and the first and second sidewalls of the dielectric fin;
   an n-type work function layer wrapping over each of the second plurality of nanostructures and extending continuously along the second sidewall and the top surface of the dielectric fin; and
   a p-type work function layer wrapping around each of the first plurality of nanostructures and disposed over the n-type work function layer, wherein the second plurality of nanostructures are spaced apart from the p-type work function layer by the n-type work function layer.

2. The semiconductor structure of claim 1, further comprising:
   an isolation feature disposed over the substrate and between the first base portion and the second base portion,
   wherein the dielectric fin is disposed on the isolation feature,
   wherein the gate dielectric layer is disposed along a top surface of the isolation feature.

3. The semiconductor structure of claim 1, wherein the p-type work function layer is in direct contact with the gate dielectric layer wrapping around each of the first plurality of nanostructures.

4. The semiconductor structure of claim 1, wherein a portion of the p-type work function layer is disposed between the second sidewall and the second plurality of nanostructures.

5. The semiconductor structure of claim 1, further comprising:
   a metal fill layer disposed over the p-type work function layer.

6. The semiconductor structure of claim 5, wherein the metal fill layer comprises tungsten (W), ruthenium (Ru), cobalt (Co) or copper (Cu).

7. The semiconductor structure of claim 5, where a portion of the metal fill layer is disposed between the first sidewall and the first plurality of nanostructures.

8. The semiconductor structure of claim 1, wherein a portion of the n-type work function layer is disposed along the first sidewall.

9. The semiconductor structure of claim 1, wherein the dielectric fin comprises silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, silicon oxide, silicon oxynitride, or silicon oxycarbonitride.

10. The semiconductor structure of claim 1, wherein the n-type work function layer comprises titanium (Ti), aluminum (Al), titanium aluminide (TiAl), titanium aluminum carbide (TiAlC), tantalum aluminum carbide (TaAlC), titanium aluminum nitride (TiAlN), tantalum silicon aluminum (TaSiAl), tantalum silicon carbide (TaSiC), tantalum silicide (TaC), hafnium carbide (HfC), or a combination thereof.

11. The semiconductor structure of claim 1, wherein the p-type work function layer comprises cobalt (Co), titanium nitride (TiN), tungsten carbonitride (WCN), titanium silicon nitride (TiSiN), tantalum nitride (TaN), molybdenum (Mo), or a combination thereof.

12. A semiconductor structure, comprising:
   a first base portion and a second base portion arising from a substrate;
   an isolation feature disposed over the substrate and between the first base portion and the second base portion;
   a first plurality of nanostructures disposed over the first base portion;
   a second plurality of nanostructures disposed over the second base portion;
   a dielectric fin disposed over the isolation feature and between the first plurality of nanostructures and the second plurality of nanostructures, the dielectric fin comprising a first sidewall facing toward the first plurality of nanostructures, a second sidewall facing toward the second plurality of nanostructures, and a top surface;
   a gate dielectric layer disposed along surfaces of each of the first plurality of nanostructure, each of the second plurality of nanostructures, the top surface of the dielectric fin, and the first and second sidewalls of the dielectric fin;
- an n-type work function layer wrapping over each of the second plurality of nanostructures and extending continuously along the second sidewall and the top surface of the dielectric fin; and
- a p-type work function layer wrapping around each of the first plurality of nanostructures and disposed over the n-type work function layer,
- wherein the n-type work function layer is in direct contact with the gate dielectric layer that wraps around each of the first plurality of nanostructures,
- wherein the second plurality of nanostructures are spaced apart from the p-type work function layer by the n-type work function layer.

13. The semiconductor structure of claim 12, further comprising:
- a metal fill layer disposed over the p-type work function layer.

14. The semiconductor structure of claim 13, wherein a portion of the p-type work function layer is disposed between the second sidewall and the second plurality of nanostructures.

15. The semiconductor structure of claim 13, where a portion of the metal fill layer is disposed between the first sidewall and the first plurality of nanostructures.

16. The semiconductor structure of claim 12, wherein a top surface of the dielectric fin is higher than a top surface of a topmost nanostructure of the first plurality of nanostructures or a top surface of a topmost nanostructure of the second plurality of nanostructures.

17. A semiconductor structure, comprising:
- a first vertical stack of nanostructures and a second vertical stack of nanostructures over a substrate;
- a dielectric fin disposed over the substrate and between the first vertical stack of nanostructures and the second vertical stack of nanostructures, the dielectric fin comprising a first sidewall facing toward the first vertical stack of nanostructures, a second sidewall facing toward the second vertical stack of nanostructures, and a top surface;
- a gate dielectric layer disposed along surfaces of each of the first vertical stack of nanostructure, each of the second vertical stack of nanostructures, the top surface of the dielectric fin, and the first and second sidewalls of the dielectric fin;
- a first work function layer wrapping over each of the second vertical stack of nanostructures and extending continuously along the second sidewall and the top surface of the dielectric fin;
- a second work function layer wrapping around each of the first vertical stack of nanostructures and disposed over the first work function layer; and
- a metal fill layer disposed over the second work function layer,
- where a portion of the metal fill layer is disposed between the first sidewall and the first vertical stack of nanostructures.

18. The semiconductor structure of claim 17, wherein a portion of the second work function layer is disposed between the second sidewall and the second vertical stack of nanostructures.

19. The semiconductor structure of claim 17, wherein the first work function layer comprises titanium (Ti), aluminum (Al), titanium aluminide (TiAl), titanium aluminum carbide (TiAlC), tantalum aluminum carbide (TaAlC), titanium aluminum nitride (TiAlN), tantalum silicon aluminum (TaSiAl), tantalum silicon carbide (TaSiC), tantalum silicide (TaC), hafnium carbide (HfC), or a combination thereof.

20. The semiconductor structure of claim 17, wherein the second work function layer comprises cobalt (Co), titanium nitride (TiN), tungsten carbonitride (WCN), titanium silicon nitride (TiSiN), tantalum nitride (TaN), molybdenum (Mo), or a combination thereof.

* * * * *